(12) United States Patent
Sato

(10) Patent No.: US 9,455,281 B2
(45) Date of Patent: Sep. 27, 2016

(54) TOUCH SENSOR, TOUCH PANEL, TOUCH PANEL MODULE, AND DISPLAY DEVICE

(71) Applicant: Semiconductor Energy Laboratory Co., Ltd., Atsugi-shi, Kanagawa-ken (JP)

(72) Inventor: Takehisa Sato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/740,982

(22) Filed: Jun. 16, 2015

(65) Prior Publication Data

US 2015/0372026 A1 Dec. 24, 2015

(30) Foreign Application Priority Data

Jun. 19, 2014 (JP) ................. 2014-125986

(51) Int. Cl.
| | | |
|---|---|---|
| H01L 27/00 | (2006.01) |
| G06F 3/042 | (2006.01) |
| H01L 27/12 | (2006.01) |
| G06F 3/041 | (2006.01) |
| G06F 3/044 | (2006.01) |

(52) U.S. Cl.
CPC ........... H01L 27/1255 (2013.01); G06F 3/044 (2013.01); G06F 3/0412 (2013.01); H01L 27/1218 (2013.01); G06F 2203/04102 (2013.01)

(58) Field of Classification Search
CPC ........... H01L 27/1255; H01L 27/1218; H01L 12/48; G06F 3/0412; G06F 3/044; G06F 3/041
See application file for complete search history.

(56) References Cited

U.S. PATENT DOCUMENTS

| | | | |
|---|---|---|---|
| 8,367,440 B2 | 2/2013 | Takayama et al. | |
| 8,377,762 B2 * | 2/2013 | Eguchi | H01L 27/12 257/43 |
| 8,415,208 B2 | 4/2013 | Takayama et al. | |
| 8,610,155 B2 | 12/2013 | Hatano et al. | |
| 8,772,075 B2 * | 7/2014 | Cho | G06F 3/0412 257/414 |
| 8,823,893 B2 | 9/2014 | Yamazaki | |
| 9,092,105 B2 * | 7/2015 | Furutani | G06F 3/044 |
| 2005/0200292 A1 | 9/2005 | Naugler et al. | |

(Continued)

FOREIGN PATENT DOCUMENTS

| | | |
|---|---|---|
| JP | 2003-174153 A | 6/2003 |
| JP | 2010-153813 A | 7/2010 |

(Continued)

*Primary Examiner* — Nikolay Yushin

(74) *Attorney, Agent, or Firm* — Fish & Richardson P.C.

(57) ABSTRACT

Objects are to simplify a process for manufacturing a touch panel, reduce manufacturing costs of a touch panel, provide a thin touch panel, increase the visibility of a touch panel, increase the detection sensitivity of a touch panel, provide a lightweight touch panel, and provide a highly reliable touch panel. A touch sensor includes a first substrate, a transistor, a first conductive film, a second conductive film, an insulating film, a third conductive film, and a second substrate. The first conductive film has a region placed between the first substrate and the second conductive film. The insulating film has a region placed between the first conductive film and the second conductive film. The first conductive film, the second conductive film, and the insulating film form a capacitor. The transistor is electrically connected to the second conductive film. The second conductive film is electrically connected to the third conductive film.

16 Claims, 13 Drawing Sheets

(56) References Cited

U.S. PATENT DOCUMENTS

| | | |
|---|---|---|
| 2006/0097991 A1 | 5/2006 | Hotelling et al. |
| 2009/0046077 A1 | 2/2009 | Tanaka et al. |
| 2009/0085891 A1 | 4/2009 | Yang et al. |
| 2010/0163874 A1 | 7/2010 | Koyama et al. |
| 2011/0001725 A1 | 1/2011 | Kurokawa |
| 2011/0037729 A1* | 2/2011 | Cho .................. G06F 3/0412 345/175 |
| 2011/0062434 A1* | 3/2011 | Eguchi ................ H01L 27/12 257/43 |
| 2011/0109591 A1* | 5/2011 | Kurokawa ......... G02F 1/13338 345/175 |
| 2012/0206325 A1* | 8/2012 | Yamazaki ............. G09G 3/003 345/87 |
| 2012/0217516 A1 | 8/2012 | Hatano et al. |
| 2013/0214324 A1 | 8/2013 | Takayama et al. |
| 2013/0257798 A1 | 10/2013 | Tamura et al. |
| 2013/0321333 A1 | 12/2013 | Tamura |
| 2014/0028616 A1* | 1/2014 | Furutani ................ G06F 3/044 345/174 |
| 2014/0043546 A1 | 2/2014 | Yamazaki et al. |
| 2014/0063368 A1 | 3/2014 | Yamazaki et al. |
| 2014/0240617 A1 | 8/2014 | Fukutome et al. |
| 2014/0357019 A1 | 12/2014 | Koyama et al. |
| 2015/0144920 A1 | 5/2015 | Yamazaki et al. |
| 2015/0255518 A1 | 9/2015 | Watanabe et al. |
| 2015/0261333 A1 | 9/2015 | Kaneyasu et al. |
| 2015/0301382 A1 | 10/2015 | Ishitani et al. |
| 2015/0301422 A1 | 10/2015 | Miyake et al. |
| 2015/0311260 A1 | 10/2015 | Senda et al. |
| 2015/0317014 A1 | 11/2015 | Miyake et al. |
| 2015/0317015 A1 | 11/2015 | Eguchi et al. |
| 2015/0317020 A1 | 11/2015 | Watanabe et al. |
| 2015/0317265 A1 | 11/2015 | Iwaki et al. |
| 2015/0318339 A1 | 11/2015 | Nakamura et al. |
| 2015/0346867 A1 | 12/2015 | Miyake |
| 2015/0349041 A1 | 12/2015 | Miyake |
| 2015/0362776 A1 | 12/2015 | Jikumaru et al. |
| 2015/0364496 A1 | 12/2015 | Kaneyasu |

FOREIGN PATENT DOCUMENTS

| | | |
|---|---|---|
| JP | 2011-028744 A | 2/2011 |
| JP | 2012-190794 A | 10/2012 |

* cited by examiner

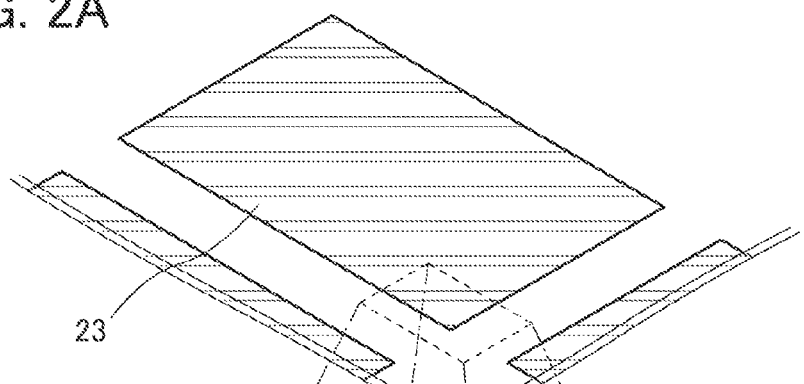
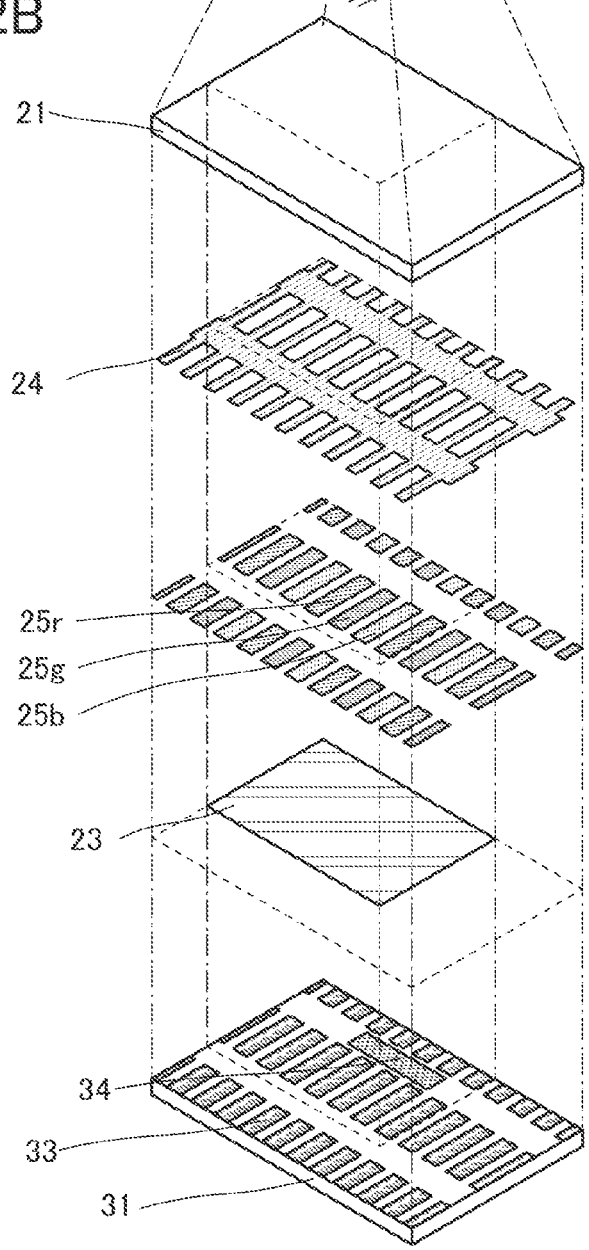

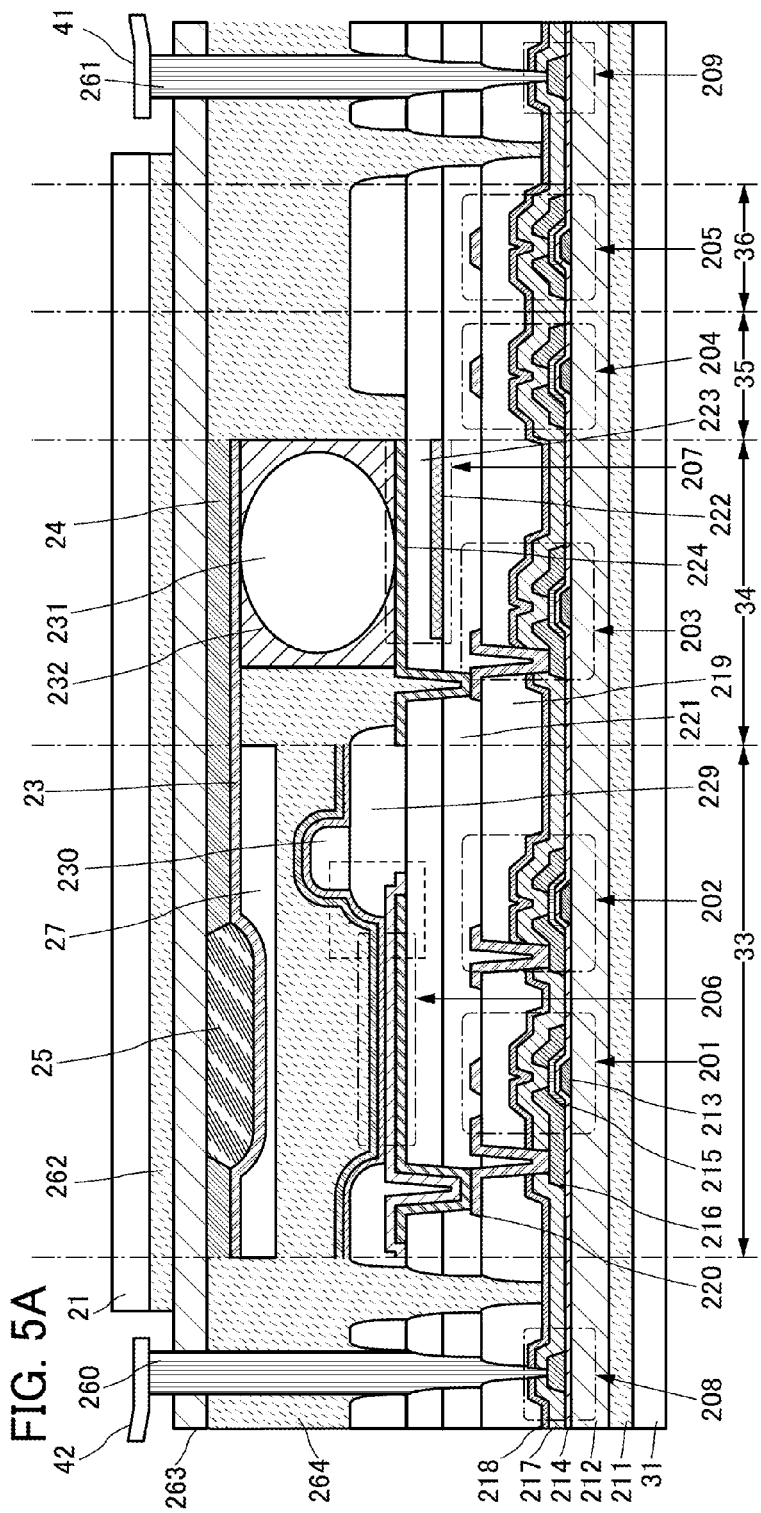
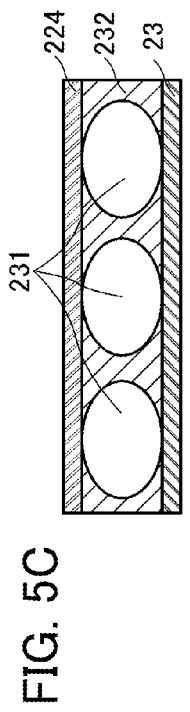
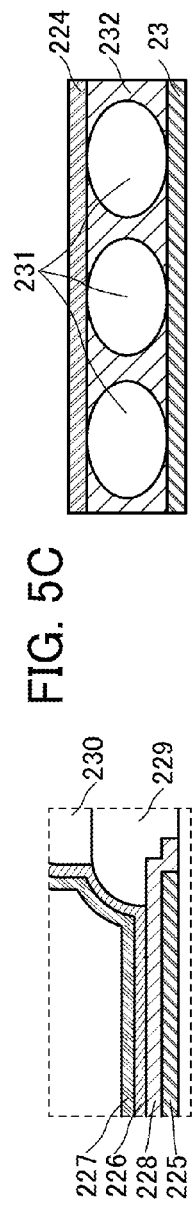

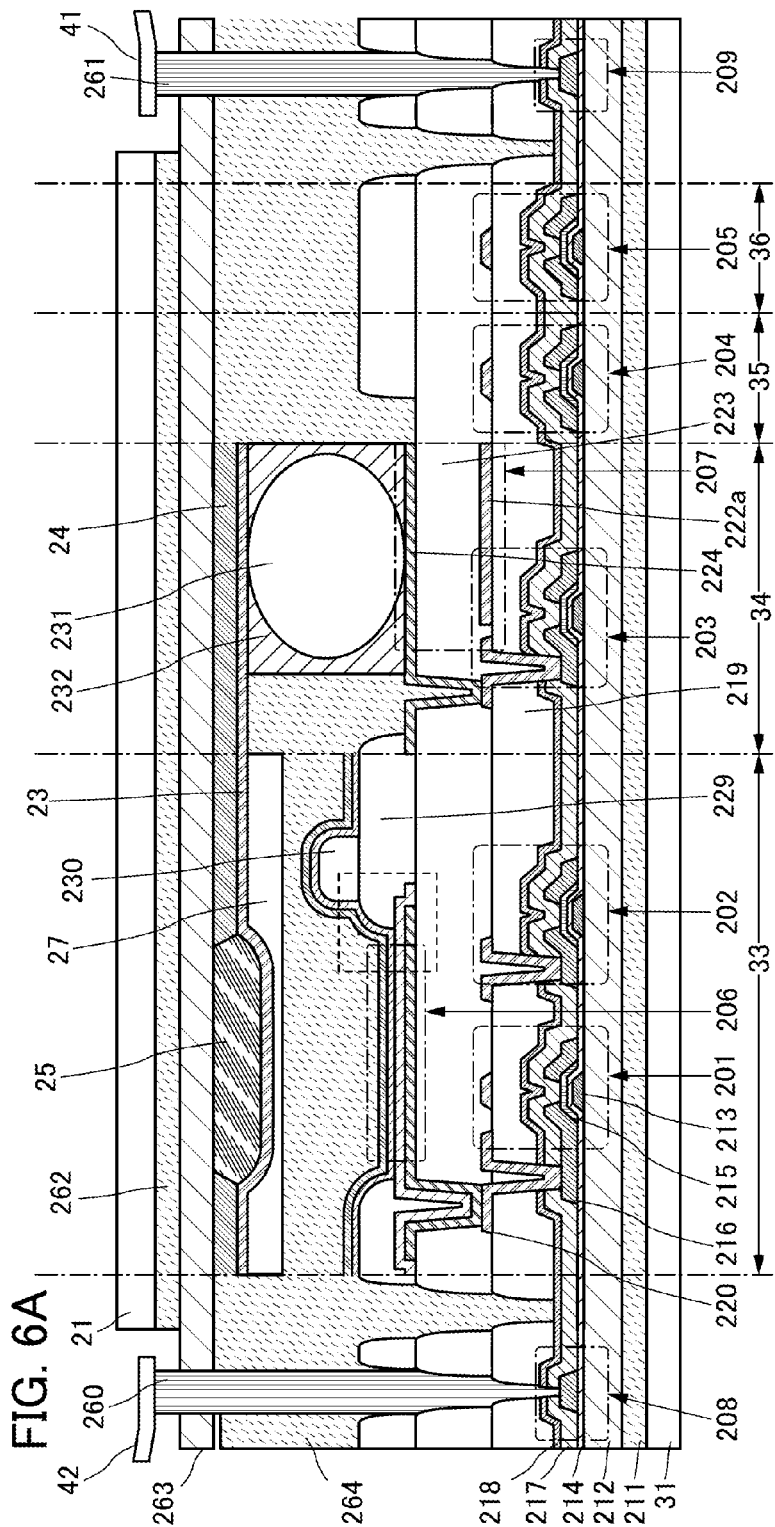
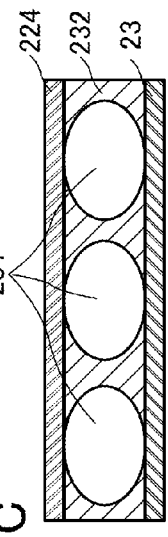
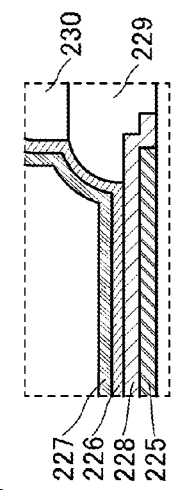
FIG. 6A
FIG. 6C
FIG. 6B

TOUCH SENSOR, TOUCH PANEL, TOUCH PANEL MODULE, AND DISPLAY DEVICE

BACKGROUND OF THE INVENTION

1. Field of the Invention

One embodiment of the present invention relates to a touch sensor and a flexible touch sensor. Another embodiment of the present invention relates to a touch panel and a flexible touch panel. Another embodiment of the present invention relates to a touch panel module and a flexible touch panel module.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, an electronic device, a lighting device, an input device, an input/output device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell and an organic thin film solar cell), and an electronic device may each include a semiconductor device.

2. Description of the Related Art

A device where a display image can be changed by touching a display surface, that is, a device where a signal is input by touching the display surface has been recently known. The device is referred to as a touch panel. Providing a touch sensor to overlap a display portion for image display enables a user to operate an electronic device more intuitively. Examples of such an electronic device include a mobile phone, a smartphone, a personal computer, a tablet, a portable game console, and a portable music player.

There are various kinds of structures of touch panels. Specific examples of touch panel structures are a structure in which a display panel is provided with an external touch sensor for detecting an input signal, and a structure in which a display panel incorporates a touch sensor. Examples of a method for detecting an input signal include a resistive touch technology, a capacitive touch technology, and an optical touch technology. Examples of the structure in which a display panel incorporates a touch sensor include an in-cell touch panel and an on-cell touch panel. There is also an active matrix touch sensor including an active element such as a transistor.

For example, Patent Document 1 discloses an in-cell optical touch panel.

REFERENCE

Patent Document 1: Japanese Published Patent Application No. 2011-028744

SUMMARY OF THE INVENTION

To provide an active matrix touch sensor for a display panel, a substrate provided with a touch sensor and a transistor and a substrate provided with a display element and a transistor have been attached to each other. Accordingly, transistors have been required to be formed on both of the substrates. Moreover, a flexible printed circuit (FPC) for supplying a signal to the touch sensor and an FPC for supplying a signal to the display element have been required to be attached to the respective substrates.

An object of one embodiment of the present invention is to provide a touch panel with a simple manufacturing process. Another object is to provide a thin touch panel. Another object is to reduce manufacturing costs of a touch panel. Another object is to increase the detection sensitivity of a touch panel. Another object is to increase the visibility of a touch panel. Another object is to provide a bendable touch panel. Another object is to provide a lightweight touch panel. Another object is to provide a touch panel with high reliability.

Another object is to provide a novel input device. Another object is to provide a novel input/output device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a touch sensor including a first transistor, a first conductive film, a second conductive film, an insulating film, and a conductor that are provided over a first substrate and a third conductive film provided on a second substrate. The first substrate has a region overlapped with the second substrate. The first conductive film has a region placed between the first substrate and the second conductive film. The insulating film has a region placed between the first conductive film and the second conductive film. The first conductive film, the second conductive film, and the insulating film form a capacitor. The conductor has a region placed between the second conductive film and the third conductive film. The third conductive film is electrically connected to the second conductive film through the conductor and functions as part of the capacitor. The first transistor is electrically connected to the second conductive film.

Another embodiment of the present invention is a touch panel including the touch sensor and a second transistor, a display element, a first film, and a second film that are provided over the first substrate. The first film has a function of transmitting light in a specific wavelength range and has a region overlapping the display element. The second film has a function of blocking visible light. The first conductive film and the second conductive film each have a region overlapped with the third conductive film. The second film has a region overlapping the second conductive film. The second transistor is electrically connected to the display element. The first transistor and the second transistor are formed in the same process.

In the above structure, the display element is preferably a light-emitting element.

In the above structure, the conductor is preferably a conductive particle.

In the above structure, the first substrate and the second substrate are preferably flexible.

Another embodiment of the present invention is a touch sensor module including the touch sensor and a first FPC. The first FPC has a function of supplying a signal to at least one of the first conductive film and the second conductive film.

Another embodiment of the present invention is a touch sensor module including the touch sensor and a second FPC. The second FPC has a function of supplying a signal to the display element.

Another embodiment of the present invention is an electronic device in which the touch sensor module or the touch panel module is incorporated in a housing.

One embodiment of the present invention can provide a touch panel with a simple manufacturing process, reduce manufacturing costs of a touch panel, provide a thin touch panel, increase the visibility of a touch panel, increase the detection sensitivity of a touch panel, provide a lightweight touch panel, or provide a touch panel with high reliability.

Another embodiment of the present invention can provide a novel input device or a novel input/output device. Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 2A and 2B illustrate a structure example of a stacked-layer structure in a touch panel module of an embodiment;

FIGS. 5A to 5C illustrate a structure example of a touch panel module of an embodiment;

FIGS. 6A to 6C illustrate a structure example of a touch panel module of an embodiment;

DETAILED DESCRIPTION OF THE INVENTION

Figure 1A:
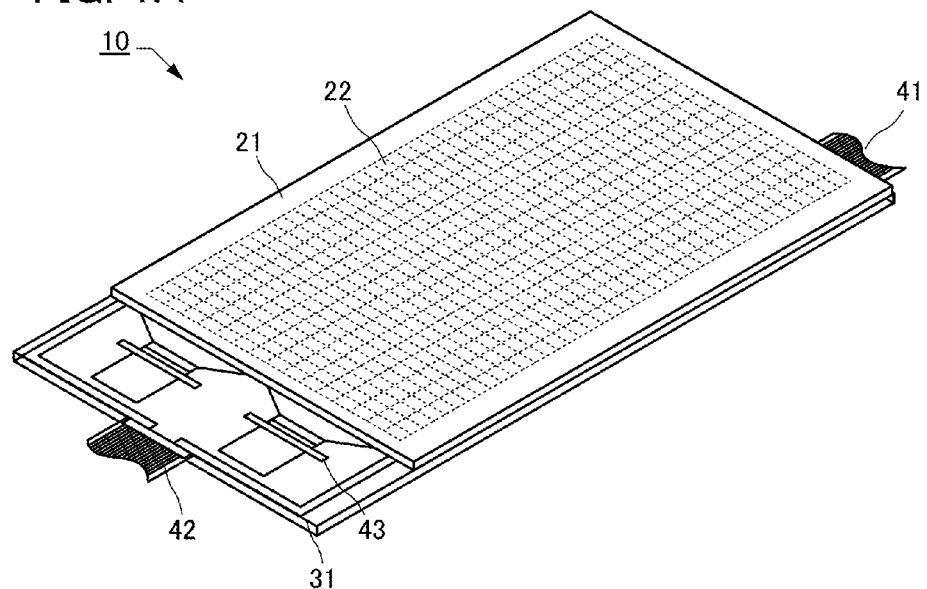
FIGS. 1A and 1B illustrate a structure example of a touch panel module of an embodiment.

Embodiments will be described in detail with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. In some cases, the same hatching pattern is used for portions having similar functions, and the portions are not denoted by reference numerals.

Note that in each drawing described in this specification, the size, the film thickness, or the region of each component is exaggerated for clarity in some cases; therefore, embodiments of the present invention are not limited to such a scale.

Note that in this specification and the like, ordinal numbers such as first and second are used in order to avoid confusion among components and do not limit the number.

A transistor is a kind of semiconductor elements and can achieve amplification of current or voltage, switching operation for controlling conduction and non-conduction, or the like. A transistor in this specification includes an insulated-gate field effect transistor (IGFET) and a thin film transistor (TFT).

Note that the terms "film" and "layer" can be interchanged with each other depending on circumstances or situations. For example, in some cases, the term "conductive film" can be used instead of the term "conductive layer," and the term "insulating layer" can be used instead of the term "insulating film."

Embodiment 1

This embodiment will explain structure examples of a touch sensor, a touch sensor module provided with a touch sensor, a touch panel, a touch panel module, and the like of one embodiment of the present invention. In the description below, a capacitive touch sensor is used as a touch sensor.

Note that in this specification and the like, an object in which a connector such as an FPC or a tape carrier package (TCP) is attached to a substrate provided with a touch sensor, or an object in which an integrated circuit (IC) is directly mounted on a substrate by a chip on glass (COG) method is sometimes referred to as a touch sensor module. Furthermore, a device having a function as a touch sensor and a function of displaying an image or the like may be referred to as a touch panel (an input/output device). An object in which the connector is attached to a touch panel or an object in which an IC is mounted on a touch panel is referred to as a touch panel module or simply referred to as a touch panel in some cases.

A capacitive touch sensor that can be used for one embodiment of the present invention includes a first transistor and a capacitor. The capacitor can have a stacked-layer structure of a first conductive film, a second conductive film, and an insulating film between the first conductive film and the second conductive film over a first substrate, for example. In this case, the first conductive film and the second conductive film function as electrodes of the capacitor, and the insulating film functions as a dielectric. In addition, a third conductive film on a second substrate is electrically connected to the second conductive film through a conductor and functions as the electrode of the capacitor. The first transistor is electrically connected to the second conductive film.

Assuming that the third conductive film among the first to third conductive films is provided on the touch surface (detection surface) side, the touch sensor of one embodiment of the present invention can detect a touch motion by detecting a capacitor formed between the third conductive film and an object to be detected, such as a finger or a stylus.

Specifically, a touch motion can be detected by detecting a change in the potential of the third conductive film due to a capacitor formed by the touch motion when a predetermined potential difference is applied between the first conductive film and the third conductive film. Note that in this specification and the like, the capacitance of a capacitor formed between an object such as a finger or a stylus and a capacitor electrode is sometimes referred to as parasitic capacitance.

Here, in a region that has a function of detecting a touch in the touch sensor, the area of the first conductive film is preferably larger than that of the second conductive film, in which case the capacitance of a capacitor between the first conductive film and the second conductive film can be reduced. Furthermore, by increasing the electrode area of the third conductive film, the capacitance of a capacitor formed between an object and the third conductive film can be increased. As a result, a change in the potential of the third conductive film at the time when the touch sensor is touched is increased; thus, detection sensitivity can be increased.

A touch panel can be formed by incorporating the touch sensor of one embodiment of the present invention in a display panel including a pixel having a second transistor and a display element. At this time, the first transistor and the second transistor are formed over the first substrate in the same steps and thus the first transistor is not required to be formed on the second substrate. Accordingly, the process for manufacturing the touch panel can be simplified and the manufacturing costs can be reduced, and in addition, the thickness of the touch panel can be reduced. Moreover, an FPC for supplying a signal to the touch sensor does not need to be mounted on the second substrate; therefore, the process for manufacturing the touch panel can be simplified and the manufacturing costs can be reduced. Furthermore, the use of a flexible material for the pair of substrates can provide a flexible touch panel that is thin and lightweight.

A more specific structure example of one embodiment of the present invention will be described below with reference to drawings.

[Structure Example]

Figure 1B:
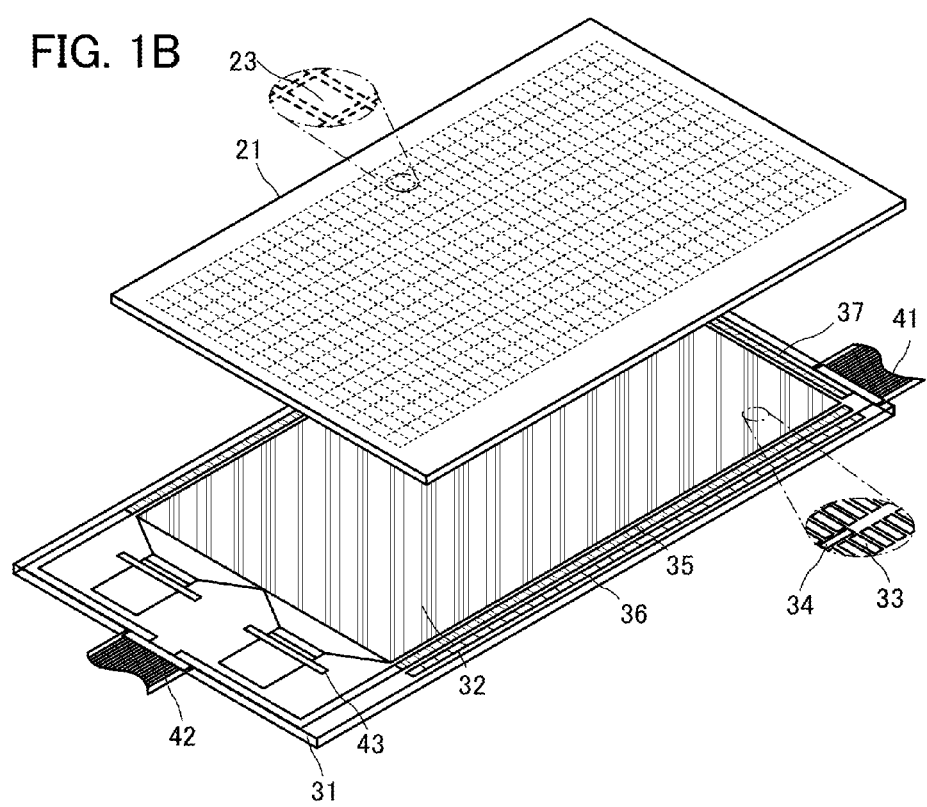

FIG. 1A is a schematic perspective view of a touch panel module 10 of one embodiment of the present invention. FIG. 1B is a schematic perspective view of the developed touch panel module 10.

The touch panel module 10 includes a touch sensor composed of a plurality of sensor units 22 arranged in a matrix. Each of the sensor units 22 includes a sensor circuit portion 34 over a first substrate 31, a conductor (not shown), and a conductive film 23 on a second substrate 21.

On the second substrate 21, a plurality of conductive films 23 are arranged in a matrix. The conductive film 23 is electrically connected to the sensor circuit portion 34 through the conductor.

The first substrate 31 includes a display portion 32. The display portion 32 includes a plurality of pixels 33 arranged in a matrix and a plurality of sensor circuit portions 34 arranged in a matrix. A circuit 35 electrically connected to the pixels 33 and a circuit 36 and a circuit 37 that are electrically connected to the sensor circuit portions 34 are preferably provided over the first substrate 31. The circuit 35 can be a circuit functioning as a gate driver circuit, for example. At least one of the circuits 36 and 37 can be a circuit having a function of selecting the sensor circuit portions 34. Moreover, at least one of the circuits 36 and 37 can be a circuit having a function of outputting a signal from the sensor circuit portions 34.

An FPC 41 has a function of supplying a signal from the outside to at least one of the sensor circuit portion 34 and the circuits 36 and 37. Furthermore, the FPC 41 has a function of outputting a signal from at least one of the sensor circuit portion 34 and the circuits 36 and 37 to the outside. An FPC 42 has a function of supplying a signal from the outside to at least one of the pixel 33 and the circuit 35. In FIGS. 1A and 1B, the first substrate 31 is provided with a terminal 43. For example, an FPC can be attached to the terminal 43; an IC functioning as a source driver circuit can be directly mounted on the terminal 43 by a COG method or a COF method; or an FPC, a TAB, a TCP, or the like on which an IC is mounted can be attached to the terminal 43.

In the touch panel module 10 of one embodiment of the present invention, the sensor unit 22 can output positional information based on a change in capacitance or parasitic capacitance at the time when the touch sensor is touched. Furthermore, an image can be displayed by the pixels 33.

[Stacked-Layer Structure in Touch Panel]

FIG. 2A is an enlarged schematic view of a region surrounded by a dashed line in FIG. 1A.

FIG. 2B is a developed schematic view of a stacked-layer structure in a region overlapping the conductive film 23.

A plurality of conductive films 23 are arranged in a matrix. One conductive film 23 is provided to overlap some pixels 33.

A plurality of pixels 33 are arranged in a matrix. In the plurality of pixels 33, some pixels are overlapped with the conductive film 23, and other pixels are overlapped with a region between two adjacent conductive films 23.

As illustrated in FIG. 2B, a light-blocking film 24, coloring films 25r, 25g, and 25b, the pixels 33, and the sensor circuit portion 34 are provided between the first substrate 31 and the second substrate 21. One conductive film 23 is provided to overlap some pixels 33 and one sensor circuit portion 34. The sensor circuit portion 34 is electrically connected to the conductive film 23 through a conductor.

Note that in the case of describing common points of the coloring films 25r, 25g, and 25b without distinguishing from one another, they are sometimes simply referred to as the coloring films 25.

Each coloring film 25 has a function of transmitting light in a particular wavelength range. Here, the coloring film 25r transmits red light, the coloring film 25g transmits green light, and the coloring film 25b transmits blue light. The pixel 33 and one of the coloring films 25 are provided to overlap each other, whereby only light in a particular wavelength range in light emitted from the pixel 33 can be transmitted toward the second substrate 21.

The light-blocking film 24 has a function of blocking visible light. The light-blocking film 24 is provided to overlap a region between two adjacent coloring films 25. In the example shown in FIG. 2B, the light-blocking film 24 has an opening provided to overlap the pixel 33 and the coloring film 25.

Although the light-blocking film 24 is provided closer to the second substrate 21 than the coloring film 25 is in FIG. 2B, the coloring film 25 may be provided closer to the second substrate 21 than the light-blocking film 24 is.

The conductive film 23 has a region overlapping the pixel 33 and the coloring film 25; thus, a material that transmits visible light is preferably used for the conductive film 23.

Figure 3A:
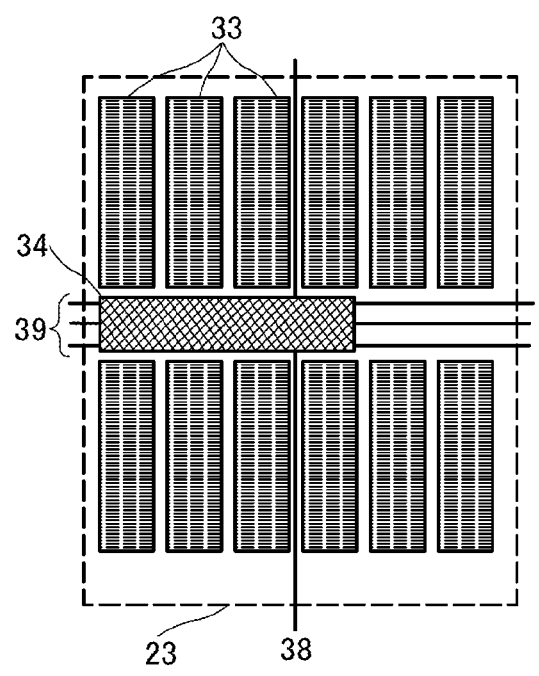
FIGS. 3A to 3C each illustrate a structure example of a stacked-layer structure in a touch panel module of an embodiment.
Figure 3B:
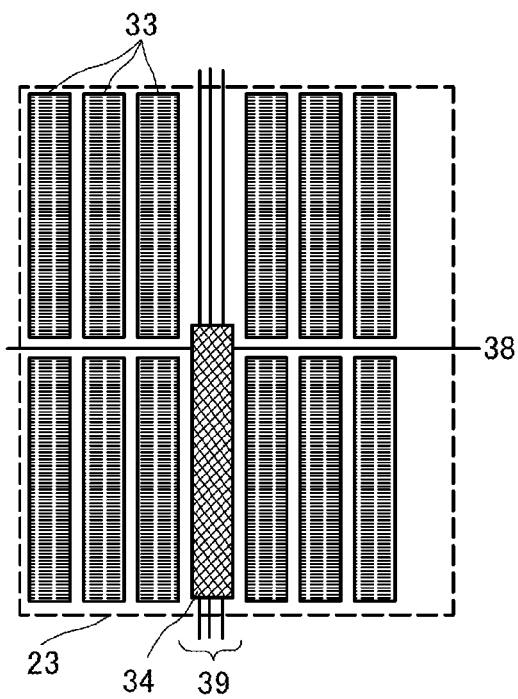
Figure 3C:
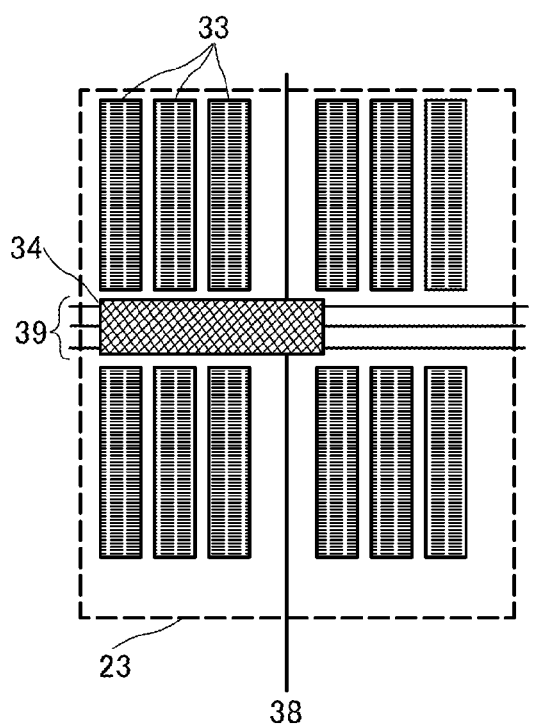

FIGS. 3A to 3C illustrate examples of arrangement of the pixels 33, the sensor circuit portion 34, a wiring 38, and wirings 39 over the first substrate 31 seen from above, in a region overlapped with one of the conductive films 23 on the second substrate 21. As illustrated in FIGS. 3A to 3C, one sensor circuit portion 34 corresponding to one conductive film 23 is placed in a region between pixels 33. Although FIGS. 3A to 3C illustrate examples in which one sensor circuit portion 34 is provided for twelve pixels 33, there is not limitation on the number of pixels 33 per sensor circuit portion 34.

The sensor circuit portion 34 may be provided in a region above and below the pixels 33 as illustrated in FIG. 3A or provided in a region on the right and left sides of the pixels 33 as illustrated in FIG. 3B. Moreover, the sensor circuit portion 34 may be provided in a region on the left, right, top and bottom sides of the pixels 33 as illustrated in FIG. 3C. Note that a region where the sensor circuit portion 34 is positioned is not limited to these examples, and the sensor circuit portion 34 can be provided anywhere except in a region where the pixel 33 is placed.

The wiring 38 is provided between two adjacent pixels 33. A plurality of wirings 39 are provided in a direction intersecting the wiring 38. The wiring 38 is electrically connected to the circuit 36. The wirings 39 are electrically connected to the circuit 37.

The sensor circuit portion 34 includes a capacitor and a first transistor electrically connected to the capacitor. The conductive film 23 is electrically connected to the capacitor through a conductor and functions as one electrode of the capacitor. The pixel 33 includes a display element and a second transistor electrically connected to the display element. Here, the first transistor is preferably formed in the same steps as the second transistor, in which case the first transistor is not required to be formed on the second substrate 21. Thus, the process for manufacturing the touch panel can be simplified, and the thickness of the touch panel can be reduced.

Figure 4:
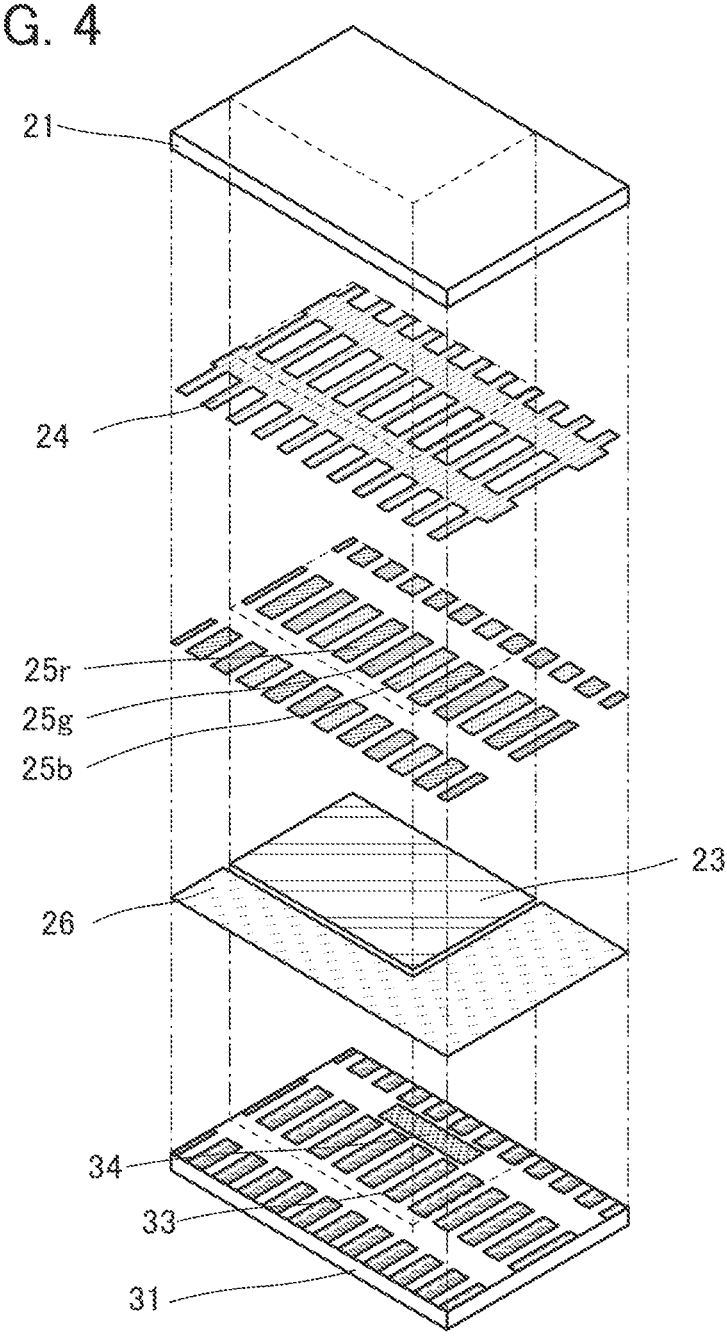
FIG. 4 illustrates a structure example of a stacked-layer structure in a touch panel module of an embodiment.

FIG. 4 illustrates the case where an optical adjustment film 26 is provided between two adjacent conductive films 23.

The optical adjustment film 26 allows a pattern of the conductive film 23 to be less recognized visually when seen from the second substrate 21 side, which increases display quality.

The optical adjustment film 26 can be formed using a material having optical properties (e.g., transmittance, refractive index, and reflectivity) close to the conductive film 23, for example, a material having transmittance within a range of ±5% of the transmittance of the conductive film 23. The optical adjustment film 26 is preferably formed using the same material as the conductive film 23. In this case, the conductive film 23 and the optical adjustment film 26 are preferably formed at the same time by processing one conductive film because the process can be simplified.

When a conductive material is used for the optical adjustment film 26, a structure in which the optical adjustment film 26 can be supplied with a predetermined potential is preferable. For example, a fixed potential such as a common potential or a ground potential may be supplied to the optical adjustment film 26. Alternatively, the optical adjustment film 26 may be electrically connected to the conductive film 23.

[Cross-Sectional Structure Examples]

Cross-sectional structure examples of the touch panel module 10 in FIG. 1A will be described below.

[Cross-Sectional Structure Example 1]

FIG. 5A is a cross-sectional schematic view of a touch panel module of one embodiment of the present invention. The thickness of the touch panel module illustrated in FIG. 5A can be small because a sensor circuit and a display element are provided over one substrate.

In the touch panel module, the first substrate 31 and the second substrate 21 are attached to each other with a bonding film 264. The coloring film 25, the light-blocking film 24, the conductive film 23, and the like are provided on the second substrate 21. A transistor 201, a transistor 202, a transistor 203, a transistor 204, a transistor 205, a light-emitting element 206, a capacitor 207, a contact portion 208, a contact portion 209, and the like are provided over the first substrate 31.

An insulating film 212, a conductive film 213, an insulating film 214, a semiconductor film 215, a conductive film 216, an insulating film 217, an insulating film 218, an insulating film 219, a conductive film 220, an insulating film 221, a conductive film 222, an insulating film 223, a conductive film 224, an insulating film 229, a spacer 230, a conductive particle 231, a connection film 232, and the like are provided over the first substrate 31 with a bonding film 211 placed therebetween.

The light-emitting element 206 such as an organic electroluminescent (EL) element is provided over the insulating film 223. The light-emitting element 206 includes a conductive film 225, an EL layer 226, and a conductive film 227 (see FIG. 5B). An optical adjustment film 228 is provided between the conductive film 225 and the EL layer 226. The insulating film 229 is provided to cover end portions of the conductive film 225 and the optical adjustment film 228.

In FIG. 5A, the pixel 33 includes the transistor 201 for current control and the transistor 202 for switching control. One of a source and a drain of the transistor 201 is electrically connected to the conductive film 224 through the conductive film 220. In addition, the sensor circuit portion 34 includes the transistor 203 and the capacitor 207. The capacitor 207 is composed of the conductive film 222, the conductive film 224, and the insulating film 223 placed between the conductive films 222 and 224. One of a source and a drain of the transistor 203 is electrically connected to the conductive film 224 through the conductive film 220. Note that the transistors 201 and 202 included in the pixel 33 and the transistor 203 included in the sensor circuit portion 34 are formed in the same steps.

As the conductor, the conductive particles 231 mixed in the connection film 232 are applied on the conductive film 224 of the capacitor 207. The conductive film 23 on the second substrate 21 is electrically connected to the conductive film 224 through the conductive particles 231 and functions as one electrode of the capacitor 207. A plurality of spherical conductive particles 231 are mixed in the connection film 232, and the conductive particles 231 are sandwiched between the conductive film 23 and the conductive film 224 and their shapes are changed by pressure (see FIG. 5C). Accordingly, the area where the conductive particles 231 are connected to the conductive film 23 and the conductive film 224 is increased, and electrical connection is ensured. Although a spherical conductive particle is shown here as the conductor for electrically connecting the conductive film 224 over the first substrate 31 and the conductive film 23 on the second substrate 21, a conductor of any shape and material can be used.

FIG. 5A illustrates a structure where the circuit 35 includes the transistor 204 and the circuit 36 includes the transistor 205.

In the example illustrated in FIG. 5A, the transistors 201 and 204 each have a structure in which a semiconductor film where a channel is formed is provided between two gate electrodes. Such transistors can have higher field-effect mobility and thus have higher on-state current than other transistors. Consequently, a circuit capable of high-speed operation is obtained. Furthermore, the area occupied by a circuit portion can be reduced. The use of the transistor having high on-state current can reduce signal delay in wirings and can suppress display unevenness even in a display panel or a touch panel in which the number of wirings is increased because of increase in size or resolution.

Note that the transistor included in the circuit 35 and the transistor included in the pixel 33 may have the same structure. Transistors included in the circuit 35 may have the same structure or different structures. Transistors included in the pixel 33 may have the same structure or different structures. Moreover, the transistor included in the circuit 36 and the transistor included in the sensor circuit portion 34 may have the same structure or different structures.

The light-emitting element 206 has a top-emission structure and emits light toward the conductive film 227. When the transistors 201 and 202, a capacitor, a wiring, and the like are provided to be overlapped with the light-emitting region of the light-emitting element 206, the aperture ratio of the pixel 33 can be increased.

An insulating film 263, the conductive film 23, the light-blocking film 24, the coloring film 25, the insulating film 27, and the like are provided on the second substrate 21 to face the first substrate 31, with the bonding film 262 placed between the second substrate 21 and the films.

The conductive film 224 is electrically connected to one of the source and the drain of the transistor 203.

The light-emitting region of the light-emitting element 206 and the coloring film 25 are provided to overlap each other, and light is emitted from the light-emitting element 206 toward the second substrate 21 through the coloring film 25.

Each coloring film 25 has a function of transmitting light in a particular wavelength range. The pixel 33 and one of the coloring films 25 are provided to overlap each other, whereby only light in a particular wavelength range in light emitted from the pixel 33 can be transmitted toward the second substrate 21.

The light-blocking film 24 has a function of blocking visible light. The light-blocking film 24 is provided to overlap a region between two adjacent coloring films 25. In the example shown in FIG. 5A, the light-blocking film 24 has an opening provided to overlap the pixel 33 and the coloring film 25.

Although the light-blocking film 24 is provided closer to the second substrate 21 than the coloring film 25 is in FIG. 5A, the coloring film 25 may be provided closer to the second substrate 21 than the light-blocking film 24 is.

The conductive film 23 has a region overlapping the pixel 33 and the coloring film 25; thus, a material that transmits visible light is preferably used for the conductive film 23.

The use of a flexible material for the first substrate 31 and the second substrate 21 achieves a flexible touch panel.

The touch panel of one embodiment of the present invention employs a color filter method. For example, it is possible to employ a structure where pixels of three colors with the coloring films 25 of red (R), green (G), and blue (B) express one color. Moreover, a pixel of white (W) or yellow (Y) may be additionally used in that structure.

Owing to the combination of the coloring films 25 and a microcavity structure using the optical adjustment film 228, light with high color purity can be extracted from the touch panel of one embodiment of the present invention. The thickness of the optical adjustment film 228 may be varied depending on the color of the pixel. It is possible that some pixels do not have the optical adjustment film 228.

The EL layer 226 of the light-emitting element 206 is preferably an EL layer that emits white light. The use of such a light-emitting element 206 eliminates the need to provide pixels with the EL layers 226 expressing different colors; thus, the costs can be reduced and the pixel density is easily increased. Furthermore, varying the thickness of the optical adjustment films 228 in the pixels enables extraction of light with a wavelength suitable for each pixel, resulting in higher color purity. Note that the EL layers 226 expressing different colors may be formed in the pixels, in which case it is possible not to use the optical adjustment film 228.

An opening is provided in the insulating films and the like in a region overlapping the contact portion 208 provided over the first substrate 31, and the contact portion 208 and the FPC 42 are electrically connected to each other with a connection film 260 provided in the opening. Similarly, the contact portion 209 and the FPC 41 are electrically connected to each other through a connection film 261 provided in an opening in the insulating films and the like.

In the structure illustrated in FIG. 5A, an electrode in the contact portion 208 and an electrode in the contact portion 209 are conductive films formed by processing a conductive film for the source electrode and the drain electrode of the transistor.

For the connection film 260 and the connection film 261, an anisotropic conductive film (ACF), an anisotropic conductive paste (ACP), or the like can be used. Moreover, the connection films 260 and 261 can be similar to the connection film 232 mixed with the conductive particles 231.

For the insulating film 212 and the insulating film 263, a material in which impurities such as water and hydrogen do not easily diffuse is preferably used, in which case the insulating film 212 and the insulating film 263 can function as a barrier film. This structure enables diffusion of impurities to the light-emitting element 206 and the transistors to be effectively suppressed even when a material with moisture permeability is used for the first substrate 31 and the second substrate 21, leading to a highly reliable touch panel.

[Components]

The above components will be described below.

The transistor includes a conductive film functioning as the gate electrode, a semiconductor film, a conductive film functioning as the source electrode, a conductive film functioning as the drain electrode, and an insulating film functioning as a gate insulating film. FIG. 5A shows the case of using bottom-gate transistors.

Note that there is no particular limitation on the structure of the transistor included in the touch panel of one embodiment of the present invention. For example, a forward staggered transistor or an inverted staggered transistor may be used. A top-gate transistor or a bottom-gate transistor may be used. There is no particular limitation on a semiconductor material used for the transistor, and an oxide semiconductor, silicon, or germanium can be used, for example.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material for the semiconductor film of the transistor, an element of Group 14, a compound semiconductor, or an oxide semiconductor can be used, for example. A semiconductor containing silicon, a semiconductor containing gallium arsenide, an oxide semiconductor containing indium, or the like can be typically used.

An oxide semiconductor is preferably used as a semiconductor in which a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). More preferably, the oxide semiconductor is In—M—Zn-based oxide (M is a metal such as Al, Ti, Ga, Ge, Y, Zr, Sn, La, Ce, or Hf).

As the semiconductor film, it is preferable to use an oxide semiconductor film including a plurality of crystal parts. Specifically, the c-axes of the crystal parts are oriented substantially perpendicular to a surface on which the semiconductor film is formed or the top surface of the semiconductor film, and adjacent crystal parts have no grain boundary.

Such an oxide semiconductor without grain boundary prevents a crack of an oxide semiconductor film from being caused by stress generated when a display panel is bent. Consequently, such an oxide semiconductor is preferably used for a flexible touch panel that is bent when used.

The use of such an oxide semiconductor for the semiconductor film achieves a highly reliable transistor with little change in the electrical characteristics.

Charge accumulated in a capacitor through a transistor can be retained for a long time because of low off-state current of the transistor. The use of such a transistor in pixels allows a driver circuit to stop while the gray level of an image displayed on display regions is maintained. As a result, a display device with extremely low power consumption is obtained.

Alternatively, silicon is preferably used as a semiconductor in which a channel of the transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has higher field-effect mobility and higher reliability than amorphous silicon. The use of such a polycrystalline semiconductor in pixels increases the aperture ratio of the pixels. Moreover, by using a polycrystalline semiconductor, a gate driver circuit and a source driver circuit can be formed over a substrate where pixels are provided even when the pixel density is quite high; thus, the number of components included in an electronic device can be decreased.

Conductive films such as a gate, a source, and a drain of the transistor and a wiring and an electrode in the touch panel can have a single-layer structure or a stacked-layer structure using any of metals such as aluminum, titanium, chromium, nickel, copper, yttrium, zirconium, molybdenum, silver, tantalum, and tungsten or an alloy containing any of these metals as its main component. For example, it is possible to employ a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; or a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used. Copper containing manganese is preferably used because controllability of shape processing by etching is increased.

As a light-transmitting conductive material, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride of the metal material), the film thickness is set small enough to transmit light. Alternatively, a stack of any of the above materials can be used as the conductive film. For example, a stacked film of indium tin oxide and an alloy of silver and magnesium is preferably used because the conductivity can be increased.

Examples of an insulating material that can be used for the insulating films, the spacer 230, and the like include a resin such as an acrylic resin or an epoxy resin, a resin having a siloxane bond, and an inorganic insulating material such as silicon oxide, silicon oxynitride, silicon nitride oxide, silicon nitride, or aluminum oxide.

The conductive particle 231 is formed in such a manner that a surface of a spherical particle of a resin such as an acrylic resin or an epoxy resin is covered with a thin film containing at least one element selected from gold, silver, copper, palladium, and platinum. Note that a conductor of any shape and material can be used, and for example, silver paste can be used. For the connection film 232, a curable resin such as a heat curable resin, a photocurable resin, or a two-component curable resin can be used. For example, an acrylic resin, a urethane resin, an epoxy resin, or a resin having a siloxane bond can be used.

As described above, the light-emitting element is preferably provided between a pair of insulating films with low water permeability, in which case impurities such as water can be prevented from entering the light-emitting element, thereby preventing a decrease in the reliability of a light-emitting device.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

For the bonding films, a curable resin such as a heat curable resin, a photocurable resin, or a two-component curable resin can be used. For example, an acrylic resin, a urethane resin, an epoxy resin, or a resin having a siloxane bond can be used.

The EL layer 226 includes at least a light-emitting layer. In addition to the light-emitting layer, the EL layer 226 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport properties), and the like.

For the EL layer 226, either a low molecular compound or a high molecular compound can be used, and an inorganic compound may be used. Each of the layers included in the EL layer 226 can be formed by any of the following methods: an evaporation method (including a vacuum evaporation method), a transfer method, a printing method, an inkjet method, a coating method, and the like.

Examples of a material that can be used for the light-blocking film 24 include carbon black, a metal oxide, and a composite oxide containing a solid solution of a plurality of metal oxides.

Examples of a material that can be used for the coloring film 25 include a metal material, a resin material, and a resin material containing a pigment or dye.

In this embodiment, a light-emitting element including an organic EL layer is used as a display element. Alternatively, it is possible to use any of various other display elements such as display elements (electronic ink) that perform display by an electrophoretic method, an electronic liquid powder (registered trademark) method, an electrowetting method, or the like; MEMS shutter display elements; optical interference type MEMS display elements; and liquid crystal elements.

Furthermore, this embodiment can be used in a transmissive liquid crystal display, a transflective liquid crystal display, a reflective liquid crystal display, a direct-view liquid crystal display, or the like. In a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as SRAM can be provided under the reflective electrodes, leading to lower power consumption. A structure suitable for employed display elements can be selected from a variety of structures of pixel circuits.

[Example of Manufacturing Method]

Here, a method for manufacturing a flexible touch panel will be described.

Here, a component including a pixel and a driver, a component including an optical component such as a color filter, or a component including a touch sensor is referred to as an element layer for convenience. An element layer includes a display element, for example, and may also include a wiring electrically connected to the display element and an element such as a transistor used in a pixel or a circuit.

Furthermore, a support (e.g., the first substrate 31 or the second substrate 21) with an insulating surface where an element layer is formed is referred to as a base.

As a method for forming an element layer over a flexible base having an insulating surface, there are a method in which an element layer is formed directly on a base; and a method in which an element layer is formed over a supporting base with stiffness, and then the element layer is separated from the supporting base and transferred to the base.

When the material of the base can withstand heating temperature in the process for forming the element layer, the element layer is preferably formed directly on the base, in which case the manufacturing process can be simplified. At this time, the element layer is preferably formed in a state where the base is fixed to the supporting base, in which case transfer of the element layer in an apparatus and between apparatuses can be easy.

In the case of employing the method in which the element layer is formed over the supporting base and then transferred to the base, first, a separation film and an insulating film are stacked over the supporting base, and then the element layer is formed over the insulating film. Subsequently, the element layer is separated from the supporting base and then transferred to the base. In this case, materials are selected so that separation occurs at the interface between the supporting base and the separation film, at the interface between the separation film and the insulating film, or in the separation film.

For example, it is preferred that the separation film have a stacked-layer structure using a film containing a high-melting-point metal material (e.g., tungsten) and a film containing an oxide of the metal material, and a film in which a plurality of layers such as a silicon nitride film and a silicon oxynitride film are stacked be formed over the separation film. The use of the high-melting-point metal material is preferable because the degree of freedom of the process for forming the element layer can be increased.

The separation may be performed by application of mechanical power, by etching of the separation film, by dripping of a liquid into part of the separation interface to penetrate the entire separation interface, or the like. Alternatively, the separation may be performed by heating the separation interface by utilizing a difference in coefficient of thermal expansion.

The separation film is not necessarily provided when separation can be performed at an interface between the supporting base and the insulating film. For example, it is possible that glass is used as the supporting base, an organic resin such as polyimide is used for the insulating film, a starting point of separation is set by locally heating the organic resin with laser light or the like, and separation is performed at the interface between the glass and the insulating film. Alternatively, it is possible that a metal film is provided between the supporting base and the insulating film formed of an organic resin, and separation is performed at the interface between the metal film and the insulating film by heating the metal film by feeding a current to the metal film. In this case, the insulating film formed of an organic resin can be used as a base.

Examples of a material of the flexible base include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, it is preferable to use a material with a low thermal expansion coefficient, for example, a polyamide imide resin, a polyimide resin, or PET, which has a thermal expansion coefficient of $30 \times 10^{-6}$ /K or less. It is also possible to use a substrate in which a fibrous body is impregnated with a resin (also referred to as prepreg) or a substrate whose thermal expansion coefficient is reduced by mixing an inorganic filler with an organic resin.

In the case where a fibrous body is included in the above material, a high-strength fiber of an organic compound or an inorganic compound is used as the fibrous body. The high-strength fiber is specifically a fiber with a high tensile modulus of elasticity or a fiber with a high Young's modulus. Typical examples include a polyvinyl alcohol-based fiber, a polyester-based fiber, a polyamide-based fiber, a polyethylene-based fiber, an aramid-based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as a flexible substrate. The structure body including the fibrous body and the resin is preferably used as a flexible substrate, in which case the reliability against bending and damage due to local pressure can be increased.

Alternatively, glass, metal, or the like that is thin enough to have flexibility can be used as the base. Alternatively, a composite material where glass and a resin material are attached to each other may be used.

In the structure shown in FIG. 5A, for example, a first separation film and the insulating film 212 are formed in this order over a first supporting base, and then components in a layer over the first separation film and the insulating film 212 are formed. Separately, a second separation film and the insulating film 263 are formed in this order over a second supporting base, and then upper components are formed. Next, the first supporting base and the second supporting base are attached to each other using the bonding film 264. After that, separation at an interface between the first separation film and the insulating film 212 is performed so that the first supporting base and the first separation film are removed, and then the insulating film 212 and the first substrate 31 are attached to each other using the bonding film 211. Furthermore, separation at an interface between the second separation film and the insulating film 263 is performed so that the second supporting base and the second separation film are removed, and then the insulating film 263 and the second substrate 21 are attached to each other using the bonding film 262. Note that either side may be subjected to separation and attachment first.

The above is the description of the method for manufacturing a flexible touch panel.

[Cross-Sectional Structure Example 2]

FIGS. 6A to 6C illustrate an example of a cross-sectional structure that is partly different from that in FIGS. 5A to 5C. The structure in FIG. 6A is mainly different from that in FIG. 5A in the structure of the capacitor 207. Note that in FIG. 6A, the same portions as those in FIG. 5A are denoted by the same reference numerals.

In FIG. 5A, the conductive film 222 is a conductive film formed by processing a film different from the conductive film 220, whereas in FIG. 6A, a conductive film 222a formed by processing a film for the conductive film 220 is used. In the structure of FIG. 6A, the capacitor 207 is composed of the conductive film 222a formed by processing a film for the conductive film 220, the conductive film 224, and the insulating film 223 placed therebetween.

With the structure illustrated in FIG. 6A, the conductive film 222a can be formed in the same step as the conductive film 220, whereby the manufacturing process can be simplified and the manufacturing costs can be reduced. Moreover, with the structure in FIG. 6A, the insulating film 221 illustrated in FIG. 5A is not required to be formed; thus, the manufacturing process can be further simplified, leading to lower manufacturing costs.

In Embodiment 1, one embodiment of the present invention has been described. Other embodiments of the present invention will be described in Embodiments 2 and 3. Note that one embodiment of the present invention is not limited to the above examples. For example, one embodiment of the present invention shows an example where the capacitor 207 and the transistor 203 are provided; however, one embodiment of the present invention is not limited to this. Depending on circumstances or situations, the capacitor 207 and/or the transistor 203 may not be provided in one embodiment of the present invention. In addition, one embodiment of the present invention shows an example where the conductive film 224 is electrically connected to the transistor 203; however, one embodiment of the present invention is not limited to this. Depending on circumstances or situations, in one embodiment of the present invention, it is possible that the conductive film 224 is not electrically connected to the transistor 203, or that the transistor 203 is not provided and thus the conductive film 224 is not electrically connected to the transistor 203.

At least part of this embodiment can be implemented in combination with any of the other embodiments described in this specification as appropriate.

Embodiment 2

In this embodiment, a structure example of a touch sensor of one embodiment of the present invention and a method for driving the touch panel will be described with reference to drawings.

[Structure Example]

Figure 7A:
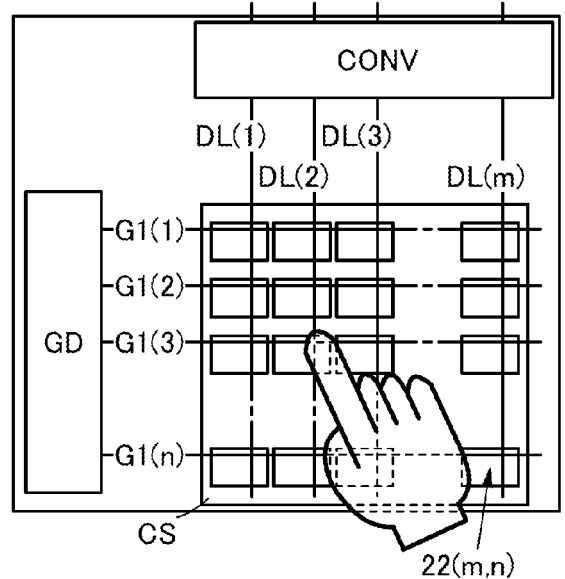
FIGS. 7A to 7E are a block diagram, circuit diagrams, and timing charts of components included in a touch panel of an embodiment.
Figure 7B:
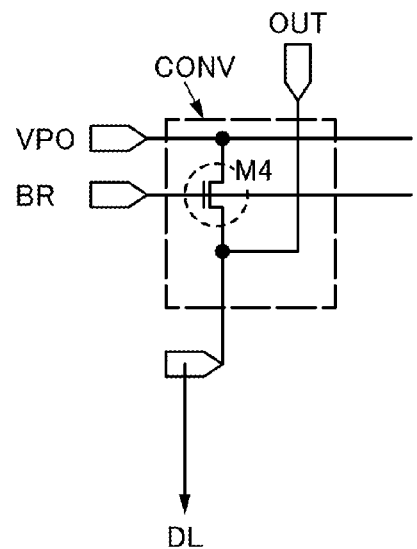
Figure 7C:
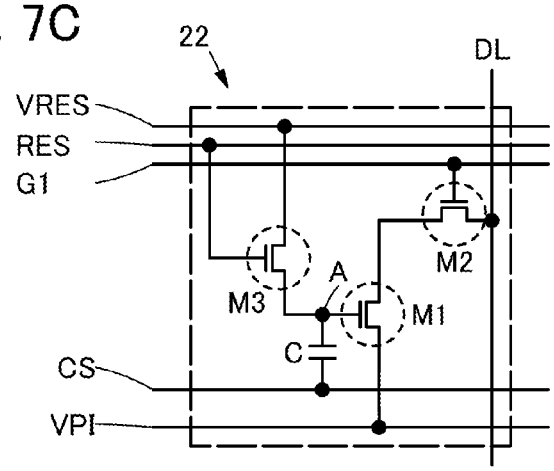
Figure 7D:
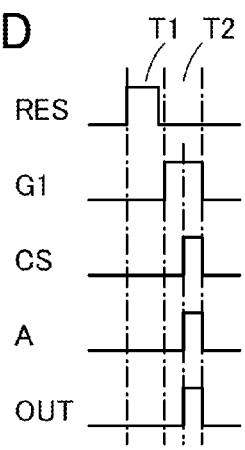
Figure 7E:
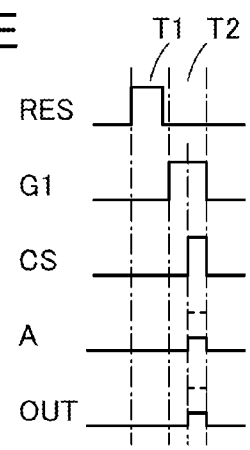

FIG. 7A is a block diagram illustrating a structure of a touch panel (also referred to as input/output device) of one embodiment of the present invention. FIG. 7B is a circuit diagram illustrating a structure of a converter CONV. FIG. 7C is a circuit diagram illustrating a structure of the sensor unit 22. FIGS. 7D and 7E are timing charts illustrating a method for driving the sensor unit 22.

The touch sensor shown in this embodiment includes a plurality of sensor units 22 arranged in a matrix, scan lines G1 electrically connected to the sensor units 22 arranged in a row direction, a driver circuit GD electrically connected to the scan lines G1, signal lines DL electrically connected to the sensor units 22 arranged in a column direction, and the converter CONV electrically connected to the signal lines DL (see FIG. 7A).

For example, the plurality of sensor units 22 can be arranged in a matrix of n rows and m columns (n and m are each a natural number or 1 or more).

The sensor unit 22 includes a capacitor C. The capacitor C corresponds to the capacitor 207 in Embodiment 1. For example, a first electrode of the capacitor C corresponds to the conductive film 224 or the conductive film 23 in Embodiment 1, and a second electrode of the capacitor C corresponds to the conductive film 222 in Embodiment 1.

The second electrode of the capacitor C is electrically connected to a wiring CS. Accordingly, a potential of the second electrode of the capacitor C can be controlled with a control signal supplied from the wiring CS.

The sensor unit 22 of one embodiment of the present invention includes at least a transistor M1. The sensor unit 22 may also include a transistor M2 and/or a transistor M3 (see FIG. 7C).

A gate of the transistor M1 is electrically connected to the first electrode of the capacitor C. A first electrode of the transistor M1 is electrically connected to a wiring VPI. The wiring VPI has a function of supplying, for example, a ground potential.

A gate of the transistor M2 is electrically connected to the scan line G1. A first electrode of the transistor M2 is electrically connected to a second electrode of the transistor M1. A second electrode of the transistor M2 is electrically connected to the signal line DL. The scan line G1 has a function of supplying, for example, a selection signal. The signal line DL has a function of supplying, for example, a sensing signal DATA.

A gate of the transistor M3 is electrically connected to a wiring RES. A first electrode of the transistor M3 is electrically connected to the first electrode of the capacitor C. A second electrode of the transistor M3 is electrically connected to a wiring VRES. The wiring RES has a function of supplying, for example, a reset signal. The wiring VRES has a function of supplying, for example, a potential capable of turning on the transistor M1.

The capacitance of the capacitor C or parasitic capacitance is changed when an object gets closer to the first electrode or the second electrode of the capacitor C or when a gap between the first electrode and the second electrode of the capacitor C is changed, for example. Thus, the sensor circuit portion 34 can supply the sensing signal DATA based on a change in the capacitance of the capacitor C or parasitic capacitance.

The wiring CS electrically connected to the second electrode of the capacitor C has a function of supplying a control signal for controlling a potential of the second electrode of the capacitor C.

Note that a node A refers to a node at which the first electrode of the capacitor C, the gate of the transistor M1, and the first electrode of the transistor M3 are electrically connected to each other.

Figure 8A:
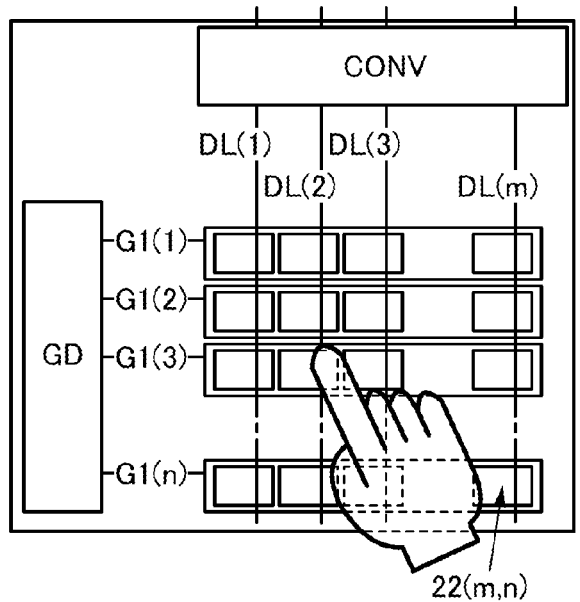
FIGS. 8A to 8C are a block diagram and circuit diagrams of components included in a touch panel of an embodiment.
Figure 8B:
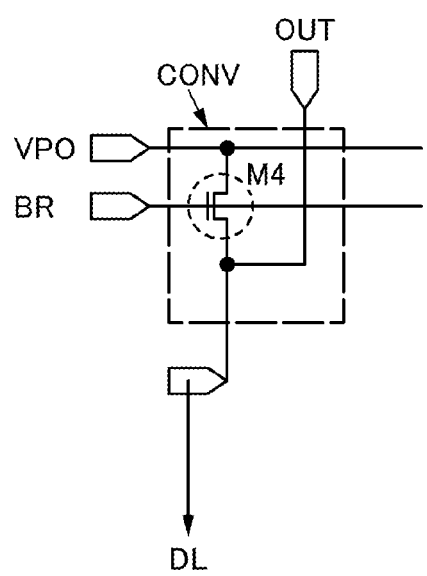
Figure 8C:
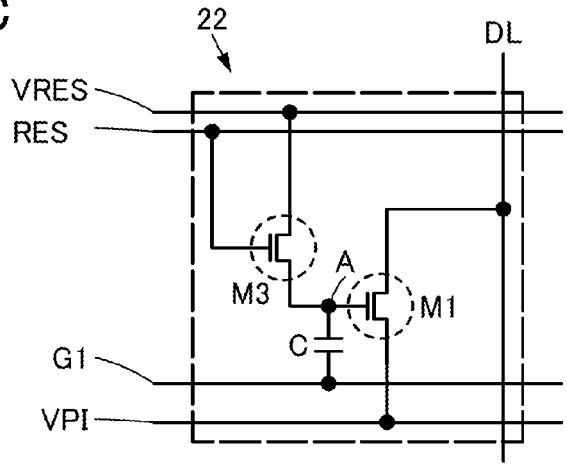

It is possible that the sensor unit 22 is not provided with the transistor M2 as illustrated in FIGS. 8A to 8C. In this case, in a plurality of sensor units 22 arranged in the row direction, the second electrode of each capacitor C is electrically connected to the scan line G1 instead of the wiring CS.

A wiring VPO and a wiring BR illustrated in FIGS. 7B and 8B each have a function of supplying, for example, a power supply potential high enough to turn on the transistor. The signal line DL has a function of supplying the sensing signal DATA. A terminal OUT has a function of supplying a signal converted based on the sensing signal DATA.

The converter CONV has a conversion circuit. Any of various circuits that can convert the sensing signal DATA and supply the converted signal to the terminal OUT can be used as the converter CONV. For example, it is possible to use a circuit that serves as a source follower circuit or a current mirror circuit formed by electrically connecting the converter CONV to the sensor circuit portion 34.

Specifically, a source follower circuit can be formed using the converter CONV including a transistor M4 (see FIGS. 7B and 8B). Note that the transistor M4 may be formed in the same process as the transistors M1 to M3.

For example, the transistors M1 to M4 can have the structure of the transistor 203 shown in Embodiment 1. The circuit 36 and the circuit 37 in Embodiment 1 can be applied to the converter CONV and the driver circuit GD, respectively.

Figure 9A:
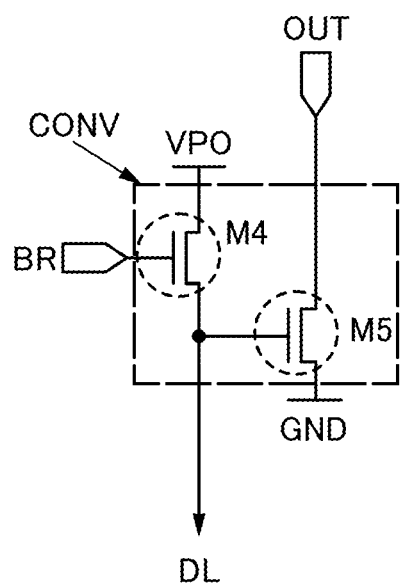
FIGS. 9A to 9C are circuit diagrams of a component in a touch panel of an embodiment.
Figure 9B:
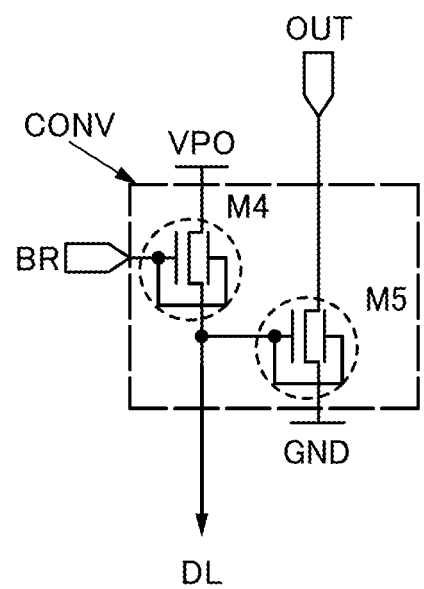
Figure 9C:
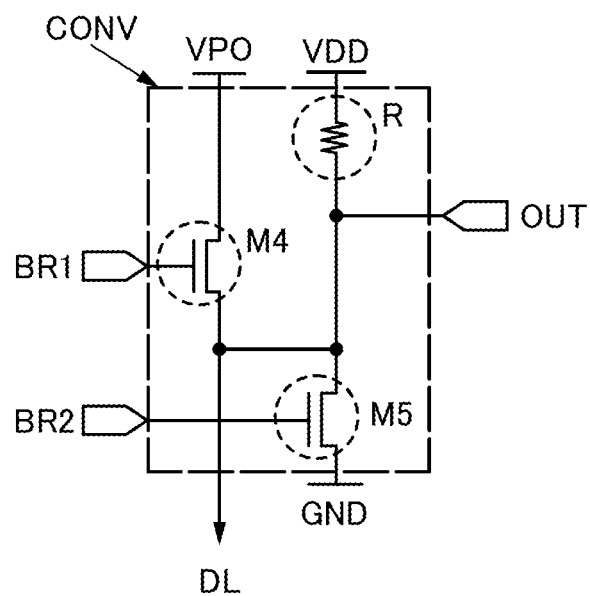

Note that the configuration of the converter CONV is not limited to that shown in FIGS. 7B and 8B. FIGS. 9A to 9C illustrate different configuration examples of the converter CONV.

The converter CONV illustrated in FIG. 9A includes a transistor M5 in addition to the transistor M4. Specifically, a gate of the transistor M5 is electrically connected to the signal line DL, a first electrode of the transistor M5 is electrically connected to the terminal OUT, and a second electrode of the transistor M5 is electrically connected to a wiring GND. The wiring GND has a function of supplying, for example, a ground potential. As illustrated in FIG. 9B, each of the transistors M4 and M5 may have a second gate that is preferably electrically connected to a gate.

The converter CONV illustrated in FIG. 9C includes the transistor M4, the transistor M5, and a resistor R. Specifically, the gate of the transistor M4 is electrically connected to a wiring BR1. The gate of the transistor M5 is electrically connected to a wiring BR2. The first electrode of the transistor M5 is electrically connected to the terminal OUT and a second electrode of the resistor R. The second electrode of the transistor M5 is electrically connected to the wiring GND. A first electrode of the resistor R is electrically connected to a wiring VDD. The wirings BR1 and BR2 each have a function of supplying, for example, a power supply potential high enough to turn on the transistor. The wiring VDD has a function of supplying, for example, a high power supply potential.

Figure 10A:
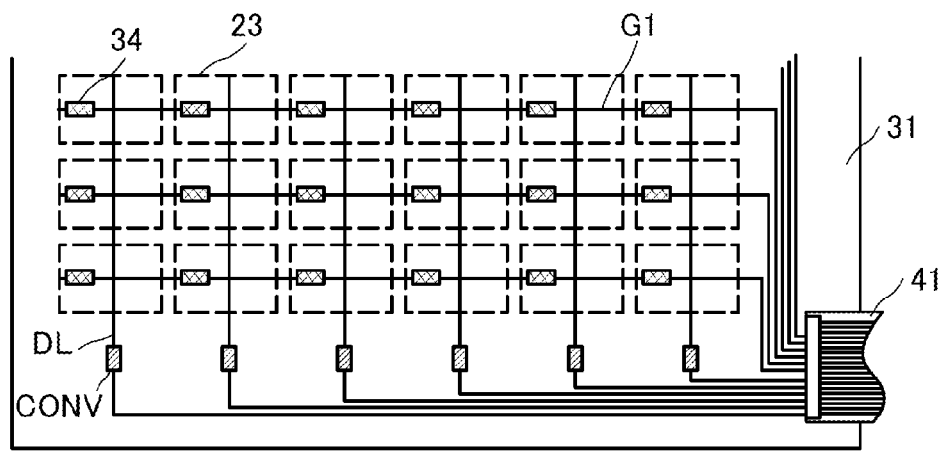
FIGS. 10A and 10B each illustrate a structure example of a touch panel of an embodiment.
Figure 10B:
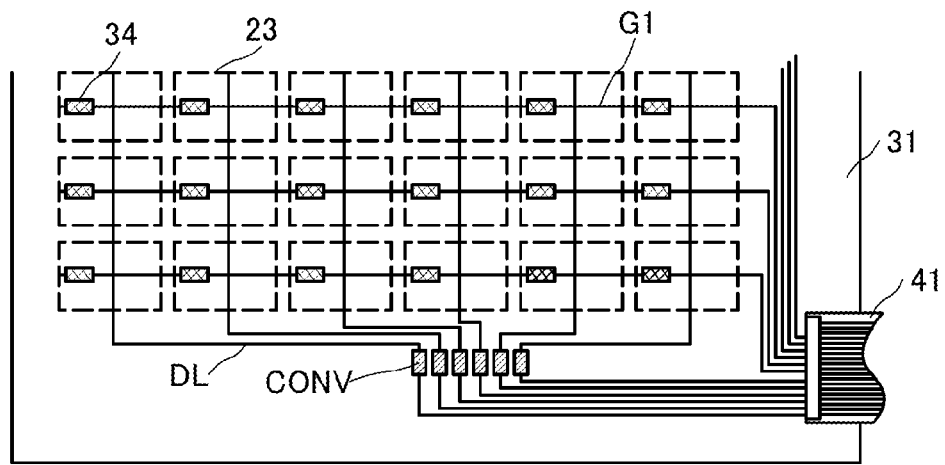

FIGS. 10A and 10B are schematic diagrams each illustrating an example of the positional relation of the converters CONV over the first substrate 31 with the conductive film 23 on the second substrate 21 and the sensor circuit portion 34, the signal lines DL, and the scan lines G1 over the first substrate 31.

When each converter CONV is provided at an end of the linearly extended signal line DL as shown in FIG. 10A, the signal lines DL electrically connected to the converters CONV can have the same length. The converters CONV are preferably arranged in this manner when the electrical resistance of the signal lines DL considerably affects the detection sensitivity, for example.

In FIG. 10B, the lengths and the shapes of the signal lines DL are made different from each other, so that the plurality of converters CONV are arranged densely. When the electrical characteristics of the transistors included in the converters CONV largely depend on their positions, arranging the converters CONV densely in this manner can reduce variations in electrical characteristics of the converters CONV and increase the detection sensitivity.

[Example of Driving Method]

Next, a method for driving the sensor unit 22 will be described with reference to FIGS. 7A to 7E.

[First Step]

In a first step, a reset signal for turning on the transistor M3 and subsequently turning off the transistor M3 is supplied to the gate of the transistor M3, and a potential of the first electrode of the capacitor C (i.e., a potential of the node A) is set to a predetermined potential (see a period T1 in FIG. 7D).

Specifically, a reset signal is supplied to the wiring RES. The transistor M3 supplied with the reset signal makes the node A have a potential capable of turning on the transistor M1, for example.

[Second Step]

In a second step, a selection signal for turning on the transistor M2 is supplied to the gate of the transistor M2, and the second electrode of the transistor M1 is made electrically connected to the signal line DL (see a period T2 in FIG. 7D).

Specifically, a selection signal is supplied to the scan line G1. The transistor M2 supplied with the selection signal electrically connects the second electrode of the transistor M1 to the signal line DL.

[Third Step]

In a third step, a control signal is supplied to the second electrode of the capacitor C, and a potential that varies depending on the control signal and the capacitance of the capacitor C or parasitic capacitance is supplied to the gate of the transistor M1.

Specifically, a rectangular control signal is supplied to the wiring CS. With supply of the rectangular control signal to the second electrode of the capacitor C, the potential of the node A is changed based on the capacitance of the capacitor C or parasitic capacitance (see the latter half of the period T2 in FIG. 7D).

For example, when the capacitor C is placed in the air and an object with a higher dielectric constant than the air comes close to the second electrode of the capacitor C, the capacitance of the capacitor C or parasitic capacitance increases apparently.

Consequently, a change in the potential of the node A due to a rectangular control signal is smaller than that when an object with a higher dielectric constant than the air is not placed close to the second electrode of the capacitor C (see a solid line in FIG. 7E).

In addition, when a gap between the first electrode and the second electrode of the capacitor C is changed by deformation of the touch panel, the capacitance of the capacitor C or parasitic capacitance is changed. Accordingly, the potential of the node A is changed.

[Fourth Step]

In a fourth step, a signal based on a change in the gate potential of the transistor M1 is supplied to the signal line DL.

For example, a current that is changed on the basis of a change in the gate potential of the transistor M1 is supplied to the signal line DL.

The converter CONV converts a change in current flowing through the signal line DL into a change in voltage and outputs the voltage, for example.

[Fifth Step]

In a fifth step, a selection signal for turning off the transistor M2 is supplied to the gate of the transistor M2.

In this manner, operation of the plurality of sensor units 22 electrically connected to one scan line G1 is completed.

When there are n scan lines G1, the first step to the fifth step are performed for each of scan lines G1(1) to G1 (n).

Figure 11A:
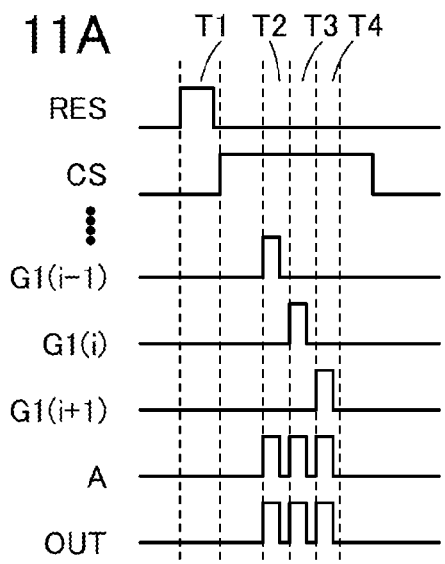
FIGS. 11A to 11C each illustrate a method for driving a touch panel of an embodiment.

Alternatively, a driving method shown in FIG. 11A may be performed when the wiring RES and the wiring CS are shared by the sensor units 22. First, a reset signal is supplied to the wiring RES. Next, with the wiring CS supplied with a control signal, a selection signal is sequentially supplied to the scan lines G1(1) to G1(n) so that a signal based on a change in the potential of the node A is supplied to signal lines DL(1) to DL(m).

With such a method, frequency of supply of reset signals and that of control signals can be reduced.

In some cases, the potential of the node A is changed over time by various causes. For example, the potential of the node A may be changed with a change in environment such as temperature and humidity.

In view of this, two kinds of rectangular control signals with opposite polarities are alternately used as rectangular control signals supplied to the second electrode of the capacitor C to obtain a difference between two sensing signals DATA, whereby a temporal change in the potential of the node A can be canceled. Such operation can increase the detection sensitivity.

Figure 11B:
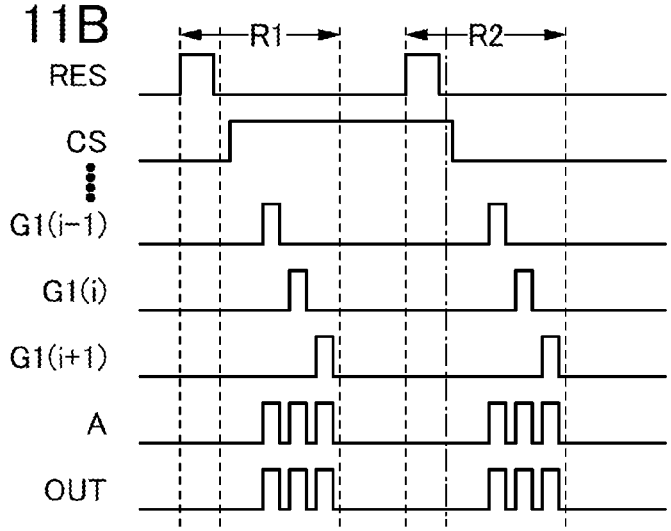

FIG. 11B shows an example of a driving method in which a period R1 and a period R2 are alternately repeated.

In the period R1 in FIG. 11B, a low-level potential is supplied to the wiring CS in a period during which a potential that turns on the transistor M3 is supplied to the wiring RES, and then a high-level potential is supplied to the wiring CS. That is, in the period R1, the sensing signal DATA based on a change in the potential of the node A is supplied to the signal line DL while the potential of the second electrode of the capacitor C is the high-level poten-
tial, and a signal converted by the converter CONV on the basis of the sensing signal DATA is supplied to the terminal OUT.

In the period R2, a high-level potential is supplied to the wiring CS in a period during which a potential that turns on the transistor M3 is supplied to the wiring RES, and then a low-level potential is supplied to the wiring CS. That is, in the period R2, the sensing signal DATA based on a change in the potential of the node A is supplied to the signal line DL while the potential of the second electrode of the capacitor C is the low-level potential, and a signal converted by the converter CONV on the basis of the sensing signal DATA is supplied to the terminal OUT.

After that, a difference between the signal supplied to the terminal OUT in the period R1 and the signal supplied to the terminal OUT in the period R2 is calculated, thereby obtaining a signal where the influence of the temporal change in the potential of the node A is canceled.

Figure 11C:
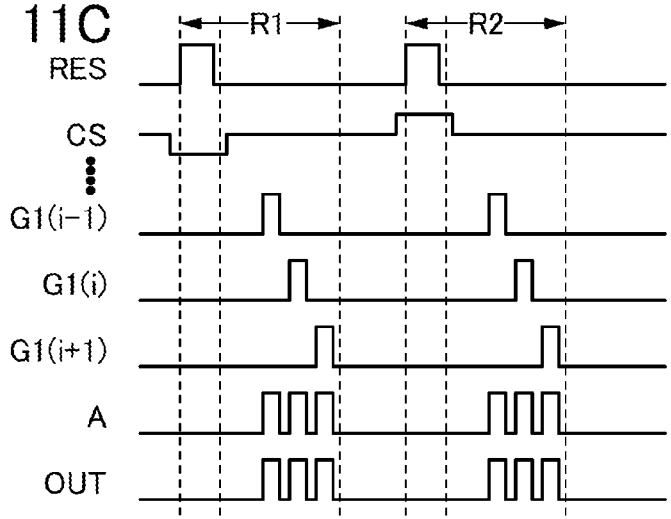

FIG. 11C shows an example of the case where a signal supplied to the wiring CS is different from that in FIG. 11B.

In FIG. 11C, a control signal supplied to the wiring CS has three kinds of potentials: a high-level potential, a middle-level potential, and a low-level potential. Specifically, in the period R1, a low-level potential is supplied to the wiring CS in a period during which a potential that turns on the transistor M3 is supplied to the signal line RES, and then, a selection signal is sequentially supplied to the scan lines G1(1) to G1(n) while a middle-level potential is supplied to the wiring CS. In the period R2, a high-level potential is supplied to the wiring CS in a period during which a potential that turns on the transistor M3 is supplied to the signal line RES, and then, a selection signal is sequentially supplied to the scan lines G1(1) to G1(n) while a middle-level potential is supplied to the wiring CS.

After that, in a manner similar to that described above, a difference between the signal supplied to the terminal OUT in the period R1 and the signal supplied to the terminal OUT in the period R2 is calculated, thereby obtaining a signal where the influence of the temporal change in the potential of the node A is canceled.

The above is the description of the driving method.

Although Embodiment 2 has explained the examples of the touch panel in one embodiment of the present invention, one embodiment of the present invention is not limited to these examples. For example, one embodiment of the present invention shows an example of the touch panel including a transistor and a capacitor; however, one embodiment of the present invention is not limited to this. Depending on circumstances or situations, the touch panel of one embodiment of the present invention may not include a transistor or a capacitor. For example, the touch sensor of one embodiment of the present invention can be of resistive, surface acoustic wave, infrared, electromagnetic induction, surface capacitive, or projected capacitive type.

At least part of this embodiment can be implemented in combination with any of the other embodiments described in this specification as appropriate.

Embodiment 3

In this embodiment, electronic devices and lighting devices that can be fabricated according to one embodiment of the present invention will be described with reference to FIGS. 12A to 12G and FIGS. 13A to 13I.

A touch panel of one embodiment of the present invention is flexible and thus is preferably used in a flexible electronic device and a flexible lighting device. According to one embodiment of the present invention, an electronic device and a lighting device that have high reliability and high resistance to repeated bending can be achieved.

Examples of electronic devices include a television set (also referred to as television or television receiver), a monitor of a computer or the like, a camera such as a digital camera and a digital video camera, a digital photo frame, a mobile phone (also referred to as a cellular phone or mobile phone device), a portable game machine, a portable information appliance, an audio reproducing device, and a large game machine such as a pachinko machine.

The touch panel of one embodiment of the present invention has flexibility and therefore can be incorporated along a curved inside/outside wall surface of a house or a building or a curved interior/exterior surface of a car.

An electronic device of one embodiment of the present invention may include a touch panel and a secondary battery. In that case, it is preferred that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

An electronic device of one embodiment of the present invention may include a touch panel and an antenna. Receiving a signal with the antenna enables a display portion to display video, information, and the like. When the electronic device includes a secondary battery, the antenna may be used for non-contact power transmission.

Figure 12A:
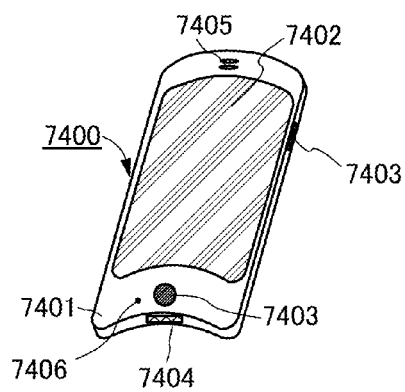
FIGS. 12A to 12G each illustrate an electronic device of an embodiment.

FIG. 12A illustrates an example of a mobile phone. A mobile phone 7400 is provided with a display portion 7402 incorporated in a housing 7401, an operation button 7403, an external connection port 7404, a speaker 7405, a microphone 7406, and the like. The mobile phone 7400 is manufactured using the touch panel of one embodiment of the present invention for the display portion 7402. According to one embodiment of the present invention, a highly reliable mobile phone having a curved display portion can be provided with a high yield.

When the display portion 7402 of the mobile phone 7400 in FIG. 12A is touched with a finger or the like, data can be input to the mobile phone 7400. Operations such as making a call and inputting letters can be performed by touch on the display portion 7402 with a finger or the like.

With the operation button 7403, the power can be turned on and off. Furthermore, types of images displayed on the display portion 7402 can be switched; for example, the image can be switched from a mail creation screen to a main menu screen.

Figure 12B:
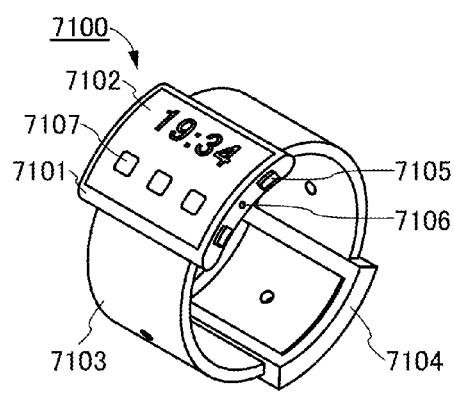

FIG. 12B illustrates an example of a wrist-watch-type portable information appliance. A portable information appliance 7100 includes a housing 7101, a display portion 7102, a band 7103, a buckle 7104, an operation button 7105, an input/output terminal 7106, and the like.

The portable information appliance 7100 is capable of executing a variety of applications such as mobile phone calls, e-mailing, reading and editing texts, music reproduction, Internet communication, and a computer game.

The display surface of the display portion 7102 is curved, and images can be displayed on the curved display surface. The display portion 7102 includes a touch sensor, and operation can be performed by touching the screen with a finger, a stylus, or the like. For example, an application can be started by touching an icon 7107 displayed on the display portion 7102.

With the operation button 7105, a variety of functions such as time setting, power on/off, on/off control of wireless communication, setting and cancellation of manner mode, and setting and cancellation of power saving mode can be performed. For example, the functions of the operation button 7105 can be set freely by the operating system incorporated in the portable information appliance 7100.

The portable information appliance 7100 can employ near field communication, which is a communication method based on an existing communication standard. In that case, for example, hands-free calling is achieved with mutual communication between the portable information appliance 7100 and a headset capable of wireless communication.

Since the portable information appliance 7100 includes the input/output terminal 7106, data can be directly transmitted to and received from another information appliance via a connector. Charging through the input/output terminal 7106 is possible. Note that the charging operation may be performed by wireless power feeding without using the input/output terminal 7106.

The display portion 7102 of the portable information appliance 7100 includes the touch panel of one embodiment of the present invention. According to one embodiment of the present invention, a highly reliable portable information appliance having a curved display portion can be provided with a high yield.

Figure 12C:
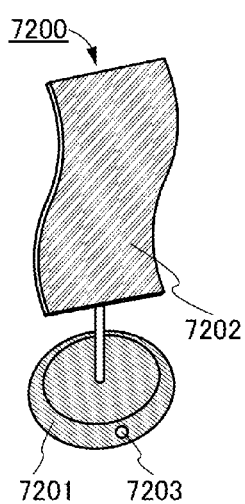
Figure 12D:
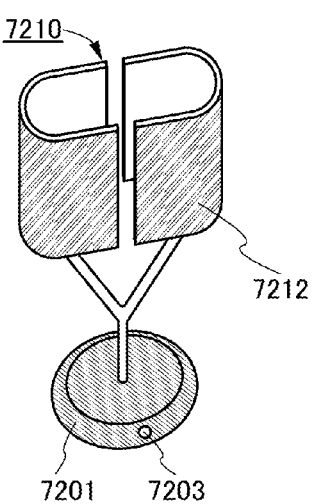
Figure 12E:
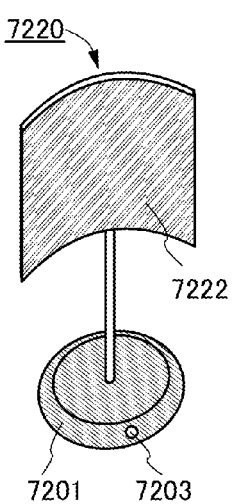

FIGS. 12C to 12E illustrate examples of lighting devices. Lighting devices 7200, 7210, and 7220 each include a stage 7201 provided with an operation switch 7203 and a light-emitting portion supported by the stage 7201.

The lighting device 7200 illustrated in FIG. 12C includes a light-emitting portion 7202 with a wave-shaped light-emitting surface and thus has a sophisticated design.

A light-emitting portion 7212 included in the lighting device 7210 in FIG. 12D has two convex-curved light-emitting portions symmetrically placed. Thus, all directions can be illuminated with the lighting device 7210 as a center.

The lighting device 7220 illustrated in FIG. 12E includes a concave-curved light-emitting portion 7222. This is suitable for illuminating a specific range because light emitted from the light-emitting portion 7222 is collected at the front of the lighting device 7220.

The light-emitting portion included in each of the lighting devices 7200, 7210, and 7220 is flexible; accordingly, the light-emitting portion may be fixed on a plastic member, a movable frame, or the like so that a light-emitting surface of the light-emitting portion can be bent freely depending on the intended use.

Although the lighting devices in which the light-emitting portion is supported by the stage are described as examples, a housing provided with a light-emitting portion can be fixed on a ceiling or suspended from a ceiling. Since the light-emitting surface can be curved, the light-emitting surface can be bent concavely so that a particular region is brightly illuminated, or bent convexly so that the whole room is brightly illuminated.

Here, each of the light-emitting portions includes the touch panel of one embodiment of the present invention. According to one embodiment of the present invention, a highly reliable lighting device having a curved light-emitting portion can be provided with a high yield.

Figure 12F:
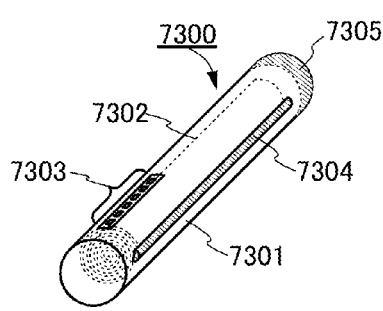

FIG. 12F illustrates an example of a portable touch panel. A touch panel 7300 includes a housing 7301, a display portion 7302, operation buttons 7303, a display portion pull 7304, and a control portion 7305.

The touch panel 7300 includes a rolled flexible display portion 7302 in the cylindrical housing 7301.

The touch panel 7300 can receive a video signal with the control portion 7305 and display the received video on the display portion 7302. The control portion 7305 includes a battery. Moreover, the control portion 7305 may include a terminal portion for connecting a connector so that a video signal or power can be directly supplied from the outside through a wire.

By pressing the operation buttons 7303, power on/off, switching of displayed video, and the like can be performed.

Figure 12G:
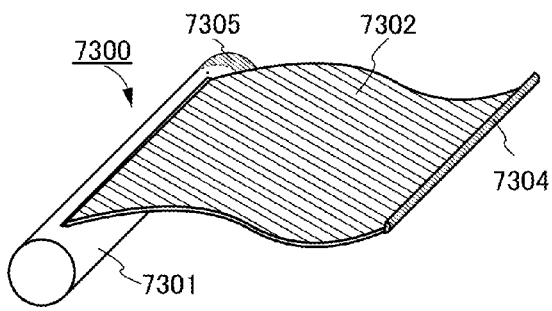

FIG. 12G illustrates the touch panel 7300 in a state where the display portion 7302 is pulled out with the display portion pull 7304. Video can be displayed on the display portion 7302 in this state. The operation buttons 7303 on the surface of the housing 7301 allow one-handed operation. The operation buttons 7303 are provided not in the center of the housing 7301 but on one side of the housing 7301 as illustrated in FIG. 12F, which makes one-handed operation easy.

A reinforcement frame may be provided for a side portion of the display portion 7302 so that the display portion 7302 has a flat display surface when pulled out.

Note that in addition to this structure, the housing may be provided with a speaker so that sound is output with an audio signal received together with a video signal.

The display portion 7302 includes the touch panel of one embodiment of the present invention. According to one embodiment of the present invention, a lightweight and highly reliable touch panel can be provided with a high yield.

Figure 13A:
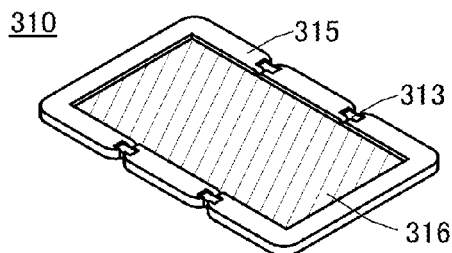
FIGS. 13A to 13I each illustrate an electronic device of an embodiment.
Figure 13B:
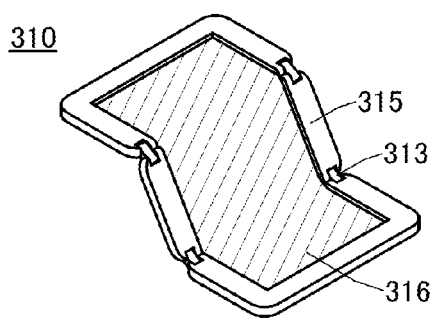
Figure 13C:
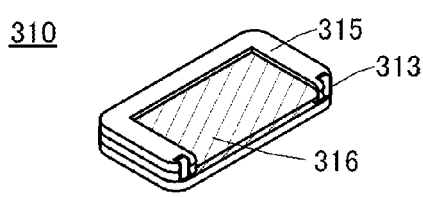

FIGS. 13A to 13C illustrate a foldable portable information appliance 310. FIG. 13A illustrates the portable information appliance 310 that is opened. FIG. 13B illustrates the portable information appliance 310 that is being opened or being folded. FIG. 13C illustrates the portable information appliance 310 that is folded. The portable information appliance 310 is highly portable when folded, and is highly browsable when opened because of a seamless large display area.

A display panel 316 is supported by three housings 315 joined together by hinges 313. By folding the portable information appliance 310 at a connection portion between two housings 315 with the hinges 313, the portable information appliance 310 can be reversibly changed in shape from an opened state to a folded state. The touch panel of one embodiment of the present invention can be used for the display panel 316. For example, it is possible to use a touch panel that can be bent with a radius of curvature of 1 mm or more and 150 mm or less.

In one embodiment of the present invention, a sensor that senses whether the touch panel is folded or opened and supplies sensing information may be provided. When obtaining information indicating that the touch panel is folded, a control portion of the touch panel may stop a folded portion (or a portion that is folded and cannot be seen by a user) from operating, specifically performing display or sensing by a touch sensor.

Similarly, the control portion of the touch panel may make display and sensing by a touch sensor restart when obtaining information indicating that the touch panel is opened.

Figure 13D:
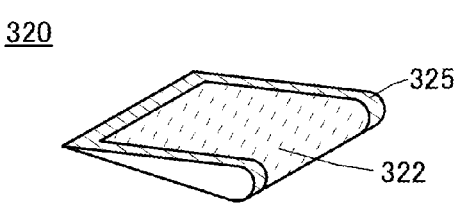
Figure 13E:
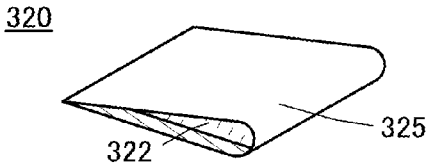

FIGS. 13D and 13E illustrate a foldable portable information appliance 320. FIG. 13D illustrates the portable information appliance 320 that is folded so that a display portion 322 is on the outside. FIG. 13E illustrates the portable information appliance 320 that is folded so that the display portion 322 is on the inside. When the portable information appliance 320 is not used, the portable information appliance 320 is folded so that a non-display portion 325 is on the outside, whereby the display portion 322 can be prevented from being contaminated or damaged. The touch panel of one embodiment of the present invention can be used for the display portion 322.

Figure 13F:
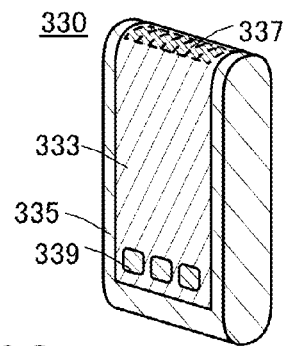
Figure 13G:
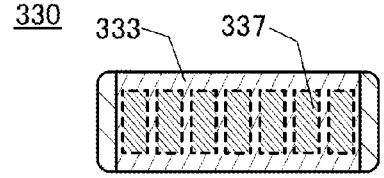
Figure 13H:
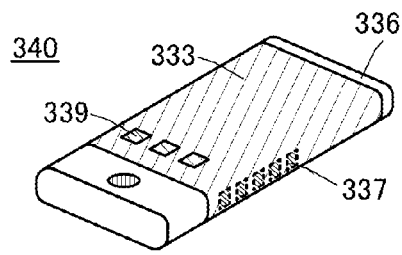

FIG. 13F is a perspective view illustrating the external shape of a portable information appliance 330. FIG. 13G is a top view of the portable information appliance 330. FIG. 13H is a perspective view illustrating the external shape of a portable information appliance 340.

Each of the portable information appliances 330 and 340 has a function of at least one of a telephone set, an electronic notebook, and an information browsing system, for example. Specifically, each of the portable information appliances 330 and 340 can be used as a smartphone.

The portable information appliances 330 and 340 can display letters and image data on their plurality of surfaces. For example, three operation buttons 339 can be displayed on one surface (FIGS. 13F and 13H). Moreover, information 337 indicated by dashed rectangles can be displayed on another surface (FIGS. 13G and 13H). Examples of the information 337 include notification of a social networking service (SNS) message, display indicating reception of an email or an incoming call, the title of an email or the like, the sender of an email or the like, the date, the time, remaining battery, and the reception strength of an antenna. Alternatively, the operation button 339, an icon, or the like may be displayed in place of the information 337. Although FIGS. 13F and 13G show the example in which the information 337 is displayed at the top, one embodiment of the present invention is not limited to this example. For instance, the information 337 may be displayed on the side as illustrated in FIG. 13H.

For example, a user can see the display (here, the information 337) with the portable information appliance 330 put in a breast pocket.

Specifically, a caller's phone number, name, or the like of an incoming call is displayed at a position that can be observed from above the portable information appliance 330. Thus, the user can see the display without taking out the portable information appliance 330 from the pocket and decide whether to answer the phone.

The touch panel of one embodiment of the present invention can be used for a display portion 333 included in a housing 335 of the portable information appliance 330 and a housing 336 of the portable information appliance 340. According to one embodiment of the present invention, a highly reliable portable information appliance having a curved display portion can be provided with a high yield.

Figure 13I:
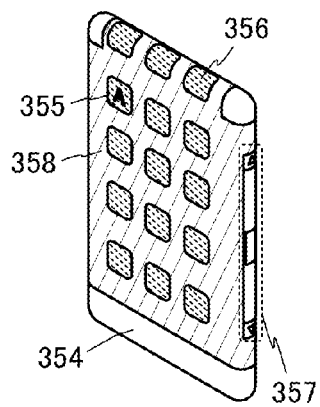

As in a portable information appliance 345 illustrated in FIG. 13I, information may be displayed on at least three surfaces. Here, as an example, information 355, information 356, and information 357 are displayed on different surfaces.

The touch panel of one embodiment of the present invention can be used for a display portion 358 included in a housing 354 of the portable information appliance 345. According to one embodiment of the present invention, a highly reliable portable information appliance having a curved display portion can be provided with a high yield.

This application is based on Japanese Patent Application serial no. 2014-125986 filed with Japan Patent Office on Jun. 19, 2014, the entire contents of which are hereby incorporated by reference.

What is claimed is:

1. A touch panel comprising:
a first substrate provided with a first transistor, a first conductive film, a second conductive film, an insulating film, a second transistor, and a display element; and
a second substrate provided with a third conductive film,
wherein the first substrate and the second substrate overlap each other,
wherein the first conductive film is located between the first substrate and the second conductive film,
wherein the insulating film is located between the first conductive film and the second conductive film to form a capacitor,
wherein the first transistor is electrically connected to the second conductive film,
wherein the second transistor is electrically connected to the display element, and
wherein the second conductive film is electrically connected to the third conductive film.

2. The touch panel according to claim 1, further comprising a first film and a second film between the first substrate and the second substrate,
wherein the first film is configured to transmit light in a specific wavelength range and overlaps the display element,
wherein the second film is configured to block visible light, and
wherein the third conductive film overlaps with the first film and the second film.

3. The touch panel according to claim 1, further comprising a conductive particle,
wherein the second conductive film is electrically connected to the third conductive film through the conductive particle.

4. The touch panel according to claim 1, wherein the display element is a light-emitting element.

5. The touch panel according to claim 1, wherein the first substrate and the second substrate are flexible.

6. The touch panel according to claim 1, wherein the first transistor and the second transistor are formed in a same process.

7. A touch panel module comprising:
the touch panel according to claim 1;
a first Flexible Printed Circuit (FPC) configured to supply a first signal to at least one of the first conductive film and the second conductive film; and
a second Flexible Printed Circuit (FPC) configured to supply a second signal to the display element.

8. An electronic device comprising the touch panel module according to claim 7.

9. A touch panel comprising:
a first transistor and a second transistor over a first substrate;
a capacitor over the first transistor, the capacitor comprising a first conductive film; an insulating film on the first conductive film; and a second conductive film on the insulating film, wherein the second conductive film is electrically connected to the first transistor;
a display element electrically connected to the second transistor;
a third conductive film over the capacitor and the display element, wherein the third conductive film is electrically connected to the second conductive film; and
a second substrate over the third conductive film.

10. The touch panel according to claim 9, further comprising:
a first film provided between a first region of the third conductive film and the second substrate, wherein the first film is configured to transmit light in a specific wavelength range and overlaps the display element; and
a second film provided between a second region of the third conductive film and the second substrate, wherein the second film is configured to block visible light.

11. The touch panel according to claim 9, further comprising a conductive particle,
wherein the second conductive film is electrically connected to the third conductive film through the conductive particle.

12. The touch panel according to claim 9, wherein the display element is a light-emitting element.

13. The touch panel according to claim 9, wherein the first substrate and the second substrate are flexible.

14. The touch panel according to claim 9, wherein the first transistor and the second transistor are formed in a same process.

15. A touch panel module comprising:
the touch panel according to claim 9;
a first Flexible Printed Circuit (FPC) configured to supply a first signal to at least one of the first conductive film and the second conductive film; and
a second Flexible Printed Circuit (FPC) configured to supply a second signal to the display element.

16. An electronic device comprising the touch panel module according to claim 15.

* * * * *